United States Patent [19]

Taguchi

[11] Patent Number: 5,376,822
[45] Date of Patent: Dec. 27, 1994

[54] HETEROJUNCTION TYPE OF COMPOUND SEMICONDUCTOR INTEGRATED CIRCUIT

[75] Inventor: Minoru Taguchi, Oomiya, Japan

[73] Assignee: Kabushiki Kaisha Toshiba, Kawasaki, Japan

[21] Appl. No.: 898,835

[22] Filed: Jun. 15, 1992

[30] Foreign Application Priority Data

Jun. 25, 1991 [JP] Japan .................. 3-153479
Nov. 7, 1991 [JP] Japan .................. 3-318549
Mar. 27, 1992 [JP] Japan .................. 4-071449

[51] Int. Cl.$^5$ .................. H01L 27/02; H01L 29/72; H01L 29/161; H01L 27/12
[52] U.S. Cl. .................. 257/574; 257/198; 257/592; 257/512; 257/555; 257/615; 257/616; 257/525
[58] Field of Search .............. 257/574, 197, 198, 592, 257/506, 510, 511, 512, 517, 523, 525, 526, 552, 555, 615, 616

[56] References Cited

U.S. PATENT DOCUMENTS

| 4,258,379 | 3/1981 | Watanabe et al. | 257/574 |
| 4,573,064 | 2/1986 | McLevige et al. | 257/574 |
| 4,599,635 | 7/1986 | Itoh et al. | 257/574 |
| 4,644,381 | 2/1987 | Shieh | 257/197 |

*Primary Examiner*—Mark V. Prenty
*Attorney, Agent, or Firm*—Foley & Lardner

[57] ABSTRACT

A heterojunction type of compound semiconductor integrated circuit in which a PNP transistor has an N type substrate made of a first compound semiconductor for mounting the PNP transistor and for insulating positive holes transmitted in the PNP transistor, a P type second compound semiconductor limitedly arranged on a part of the substrate for functioning as an emitter of the PNP transistor, an N type third compound semiconductor arranged on both the second compound semiconductor and the substrate for functioning as a base of the PNP transistor, electrons being applied from the substrate to the third compound semiconductor, a P type fourth compound semiconductor limitedly arranged on a part of the N type third compound semiconductor, a P+ type fifth compound semiconductor arranged on the part of the fourth compound semiconductor for functioning as a collector contact layer of the PNP transistor, an emitter contact layer limitedly arranged on a second part of the second compound semiconductor for supplying positive holes to the second compound semiconductor, the surface of the emitter contact layer being the same height as that of the fifth compound semiconductor so as to form a flat surface, and an isolation region sandwiched between the emitter contact layer and the fifth compound semiconductor for electrically isolating the emitter contact layer from both the second P+ type fifth compound semiconductor and the fourth compound semiconductor.

16 Claims, 21 Drawing Sheets

HETEROJUNCTION TYPE OF COMPOUND SEMICONDUCTOR INTEGRATED CIRCUIT

BACKGROUND OF THE INVENTION

1. Field of the Invention

The present invention relates to a method for manufacturing a heterojunction type of compound semiconductor integrated circuit and the heterojunction type of compound semiconductor integrated circuit, and, in particular, to a method for manufacturing a circuit comprising a semi-insulating substrate, a vertical heterojunction type of PNP bipolar transistor formed on the semi-insulating substrate, and a vertical heterojunction type of NPN bipolar transistor formed on the semi-insulating substrate, and the circuit.

2. Description of Background

Nowadays, high density and large integrated semiconductor circuits have been developed so that the process in the circuit is implemented at high speed. Therefore, for example, bipolar transistors have been efficiently utilized.

In a method for utilizing bipolar transistors, the precise control of a base region can be easily implemented as compared with the control of a channel length of a metal-oxide-semiconductor (MOS) transistor. Therefore, the process in the bipolar transistor can be easily implemented at high speed. However, there are drawbacks in that the separation of the bipolar transistors is difficult and the number of the processing steps for manufacturing the bipolar transistors on a substrate is large.

Therefore, an integrated injection logic (IIL) circuit has been proposed to solve the above drawbacks.

FIG. 1 is a cross sectional view of a silicon IIL circuit. FIG. 2 is an equivalent circuit of the IIL shown in FIG. 1.

As shown in FIG. 1, a silicon IIL circuit 11 comprises:
- an N+ type silicon semiconductor substrate 12 with heavily doped donors;
- an N type silicon epitaxial grown layer 13 in which device regions are formed;
- a P+ type emitter diffused layer 14 formed in one of the device regions with heavily doped acceptors, an electrode E being attached on the emitter diffused layer 14;
- a P+ type base diffused layer 15 formed in the other device region with heavily doped acceptors, an electrode B being attached on the base diffused layer 15;
- a pair of N+ type diffused layers 16 (16a, 16b), electrodes C1, C2 being attached on the base diffused layer 15; and
- a thermal oxidation film 17 for shielding both the silicon epitaxial grown layer 13 and the base diffused layer 15.

A horizontal PNP bipolar transistor 18 is fabricated by the silicon epitaxial grown layer 13 (base of transistor 18), the emitter diffused layer 14 (emitter of transistor 18), and the base diffused layer 15 (collector of transistor 18). In addition, a vertical NPN bipolar transistor 19 is fabricated by the silicon epitaxial grown layer 13 (emitter of transistor 19), the base diffused layer 15 (base of transistor 19), and the diffused layers 16 (collector of transistor 19).

In the above configuration, the operation in the silicon IIL circuit 11 is described with reference to FIG. 2.

The electrode E is set at a high positive electric potential, and the silicon semiconductor substrate 12 is set at a negative electric potential. In this condition, when an input terminal connected with the electrode B is set at a low electric potential, positive holes are injected from the electrode E to the electrode B through the horizontal PNP bipolar transistor 18. That is, the positive holes are transmitted from the emitter diffused layer 14 to the base diffused layer 15 through the silicon epitaxial grown layer 13. Also, the vertical NPN bipolar transistor 19 is turned off so that the electric potential of output terminals connected with the electrodes C1, C2 are kept at a high electric potential.

Accordingly, when the input terminal is set at the low electric potential, the output terminals are kept at the high electric potential.

On the other hand, when the input terminal is set at a high electric potential, positive holes are injected from the electrode E to the silicon epitaxial grown layer 13 through both the horizontal PNP bipolar transistor 18 and the vertical NPN bipolar transistor 19. Therefore, the vertical NPN bipolar transistor 19 is turned on so that the electric potential of the output terminals is changed at a low electric potential.

Accordingly, when the input terminal is set at the high electric potential, the output terminals are changed at the low electric potential.

Therefore, the silicon IIL circuit 11 functions as a NOT circuit with multiple output terminals. In addition, the electrode E is operated as an injector.

In general, the number of the output terminals must agree with the number of the diffused layers 16. However, even though a large number of output terminals are required, the diffused layer 16 can be easily increased because the diffused layers 16 are fabricated in the base diffused layer 15 in parallel.

In addition, the manufacturing process in the silicon IIL circuit 11 is simplified. A first reason is that both the horizontal PNP bipolar transistor 18 and the vertical NPN bipolar transistor 19 are fabricated in the silicon epitaxial grown layer 13. A second reason is that the base of the horizontal PNP bipolar transistor 18 shares the silicon epitaxial grown layer 13 with the emitter of the vertical NPN bipolar transistor 19. A third reason is that the collector of the horizontal PNP bipolar transistor 18 shares the base diffused layer 15 with the base of the vertical NPN bipolar transistor 19.

Therefore, a large integrated silicon IIL circuit 11 can be easily manufactured.

However, frequency characteristics deteriorate in the silicon IIL circuit 11 because the vertical NPN bipolar transistor 19 is operated in a reverse connection region. In addition, propagation delay time is prolonged because minority carriers (positive holes) are stored in the silicon epitaxial grown layer 13.

Next, another conventional silicon IIL circuit in which the frequency characteristics and the propagation delay time are improved is described with reference to FIG. 3.

As shown in FIG. 3, a silicon IIL circuit 21 is provided with an emitter diffused layer 22 prolonged directly under the base diffused layer 15 in place of the emitter diffused layer 14 as compared with the silicon IIL circuit 11. That is, a vertical PNP bipolar transistor 23 is fabricated in the silicon IIL circuit 21.

Therefore, the positive holes stored in the silicon epitaxial grown layer 13 are decreased because the surface area transmitting the positive holes from the emitter diffused layer 22 is increased. Therefore, the propagation delay time is shortened so that the lifetime of the positive holes is substantially shortened.

Accordingly, the frequency characteristics are improved so that a current amplification factor $h_{fe}$ in the PNP transistor is improved.

In addition, because the vertical PNP bipolar transistor 23 is fabricated in a vertical direction against the substrate 12, the emitter diffused layer 22 can be easily formed by controlling its diffused length regardless of whether the base thickness in the PNP transistor 23 is required to be uniform and narrow.

As a result, as shown in FIG. 4, a direct current transfer ratio $\alpha$ at grounded base is largely improved in the vertical PNP bipolar transistor 23. In addition, the characteristics in the relation between the direct current transfer ratio $\alpha$ and a collector current Ic are improved. Here, the current amplification factor $h_{fe}$ is equal to $\alpha/(1-\alpha)$ by utilizing the direct current transfer ratio $\alpha$.

On the other hand, in cases where a heterojunction type of bipolar transistor is made of compound semiconductors, both the emitter capacitance and the base resistance can be decreased while the current amplification factor $h_{fe}$ is kept to a high value. Therefore, the heterojunction type of bipolar transistor made of compound semiconductors can be operated at high speed as compared with the heterojunction type of bipolar transistor made of silicon materials.

Recently, manufacturing techniques such as a device isolation technique, an ion implanting technique, an ion implant and isolation technique, a grading technique utilized in heterojunction interfaces (graded impurity profile technique), a self aligning technique, a miniaturing technique, and a high quality epitaxial technique has been advanced to develop the heterojunction type of bipolar transistor made of compound semiconductors. As a result, the heterojunction type of bipolar transistor is operated to generate oscillating signals at a frequency more than 100 GHz. Moreover, the operation at an oscillating frequency more than 300 GHz will be possible by miniaturing element devices in the not too distant future.

Moreover, a plurality of devices made of the compound semiconductors such as a PNP transistor, an IIL circuit, a resistor, and a capacitor are fabricated on a substrate. In this case, the compound semiconductors such as GaAs and InP have been utilized.

Therefore, for example, both the current amplification factor $h_{fe}$ and the propagation delay time can be further improved in the IIL circuit with a vertical PNP transistor which is made of the compound semiconductor.

However, in cases where the configuration of the IIL circuit made of the compound semiconductor is the same as that of the silicon IIL circuit 21 shown in FIG. 3, the characteristics obtained in the silicon IIL circuit 21 cannot be obtained in the IIL circuit made of the compound semiconductor. For example, the current amplification factor $h_{fe}$ is largely decreased as the collector current 21 is decreased. The reason is as follows.

As shown in FIG. 3, a horizontal PNP transistor 24 is parasitically fabricated by the silicon epitaxial grown layer 13, the base diffused layer 15, and the vertical portion of the emitter diffused layer 22 in the silicon IIL circuit 21. The horizontal PNP transistor 24 does not function as a heterostructure type of bipolar transistor but functions as a diffused type of bipolar transistor because the horizontal PNP transistor 24 is arranged at the surface of the silicon IIL circuit 21.

Therefore, in cases where the collector current Ic is low, direct current characteristics largely deteriorate in the silicon IIL circuit made of the compound semiconductors.

In addition, the current amplification factor $h_{fe}$ is decreased and fluctuates because the base thickness of the horizontal PNP transistor 24 is not determined by the width of the silicon epitaxial grown layer 13 between the base diffused layer 15 and the vertical portion of the emitter diffused layer 22 but determined by the diffusion of both the base diffused layer 15 and the vertical portion of the emitter diffused layer 22.

Moreover, alternating current characteristics deteriorates because the horizontal PNP transistor 24 does not function as a heterostructure type of bipolar transistor. For example, the frequency of oscillating signals obtained in the silicon IIL circuit made of the compound semiconductors is a several MHz at the most.

Furthermore, in cases where a plurality of devices made of the compound semiconductors such as a heterojunction type of bipolar transistor are fabricated on a substrate, the devices are formed at a mesa structure to increase an active region and decrease a saturation region so that the current amplification factor $h_{fe}$ is improved. However, in this case, a large number of differences in level are generated in the devices. Therefore, hard-wires connecting the devices are easily cut off at different portions in level. As a result, the devices cannot be miniaturized so that a large scaled integrated circuit cannot be manufactured in the heterojunction type of compound semiconductor.

SUMMARY OF THE INVENTION

A first object of the present invention is to provide, with due consideration to the drawbacks of such conventional device, a method for manufacturing a heterojunction type of compound semiconductor integrated circuit in which a vertical type of transistors excellent in the characteristics such as the current amplification factor $h_{fe}$ and the propagation delay time are fabricated on a substrate.

A second object of the present invention is to provide a method for manufacturing a heterojunction type of compound semiconductor integrated circuit in which a hardwire securely connects devices made of the compound semiconductors in cases where the devices are fabricated on a substrate.

A third object of the present invention is to provide a heterojunction type of compound semiconductor integrated circuit manufactured by the method relating to the first object.

A fourth object of the present invention is to provide a heterojunction type of compound semiconductor integrated circuit manufactured by the method relating to the second object.

The first and second objects are achieved by the provision of a method for manufacturing a heterojunction type of compound semiconductor integrated circuit in which a PNP transistor is fabricated, comprising the steps of:

preparing an N type substrate made of a first compound semiconductor, the substrate insulating positive holes transmitted in the PNP transistor;

limitedly depositing a P type second compound semiconductor on a part of the substrate, the second compound semiconductor functioning as an emitter off the PNP transistor;

depositing an N type third compound semiconductor on both the second compound semiconductor and the substrate, the third compound semiconductor on the second compound semiconductor functioning as a base of the PNP transistor;

strongly inverting the N type third compound semiconductor positioned on a part of the second compound semiconductor to a P+ type third compound semiconductor, the P+ type third compound semiconductor reaching the part of second compound semiconductor from the surface of the third compound semiconductor;

limitedly depositing a P type fourth compound semiconductor on a part of the N type third compound semiconductor, (1) the fourth compound semiconductor being spaced from the P+ type third compound semiconductor, (2) a part of the fourth compound semiconductor being arranged just above the second compound semiconductor, and (3) the part of the fourth compound semiconductor functioning as a collector of the PNP transistor;

depositing an N type fifth compound semiconductor on both the third and fourth compound semiconductors, the P+ type third compound semiconductor being covered by the fifth compound semiconductor;

strongly inverting the N type fifth compound semiconductor covering the P+ type third compound semiconductor to a first P+ type fifth compound semiconductor, (1) the first P+ type fifth compound semiconductor reaching the P+ type third compound semiconductor from the surface of the fifth compound semiconductor, (2) both the P+ type third compound semiconductor and the first P+ type fifth compound semiconductor functioning as an emitter contact layer of the PNP transistor;

strongly inverting the N type fifth compound semiconductor arranged on the part of the fourth compound semiconductor to a second P+ type fifth compound semiconductor, the second P+ type fifth compound semiconductor functioning as a collector contact layer of the PNP transistor; and damaging the N type fifth compound semiconductor sandwiched between the first P+ type fifth compound semiconductor and the fourth compound semiconductor, (1) the damaged fifth compound semiconductor reaching the upper portion of the third compound semiconductor, (2) atomic bonds in the damaged fifth compound semiconductor being cut off, and (3) a flat surface being formed by the N type fifth compound semiconductor, the first P+ type fifth compound semiconductor, the second P+ type fifth compound semiconductor, and the damaged fifth compound semiconductor.

In the above steps, the PNP transistor comprises the emitter made of the P type second compound semiconductor, the base made of N type third compound semiconductor, and the collector made of the P type fourth compound semiconductor. Therefore, the PNP transistor is made of a plurality of compound semiconductors so that the heterojunction type of PNP transistor is fabricated.

Accordingly, the frequency characteristics are excellent as compared with a conventional silicon type of integrated circuit.

In addition, the second compound semiconductor is electrically connected with both the P+ type third compound semiconductor and the P+ type fifth compound semiconductor.

Moreover, positive holes supplied to the P+ type fifth compound semiconductor cannot be horizontally transmitted to the collector of the PNP transistor because the N type fifth compound semiconductor sandwiched between the first P+ type fifth compound semiconductor and the P type fourth compound semiconductor arranged just above the second compound semiconductor is damaged. That is, the atomic bonds in the damaged fifth compound semiconductor are cut off so that a large number of levels for trapping the positive holes are generated. Therefore, the positive holes cannot pass through the damaged fifth compound semiconductor.

As a result, the positive holes are vertically transmitted to the second P+ type fifth compound semiconductor arranged just above the second compound semiconductor through the fourth compound semiconductor after the positive holes supplied to the first P+ type fifth compound semiconductor are transmitted to the second compound semiconductor.

Accordingly, the frequency characteristics in the PNP transistor are largely improved because the base thickness of the PNP transistor is precisely controlled by depositing the third compound semiconductor.

Moreover, because both the P+ type third and fifth compound semiconductors are arranged on the second compound semiconductor, the surface of the compound semiconductor integrated circuit is flat. Therefore, no difference in level is generated in cases where hard-wires are fabricated on the compound semiconductor integrated circuit.

Accordingly, the hard-wires can be securely arranged on the compound semiconductor integrated circuit.

The first and second objects are also achieved by adding the steps as follows:

strongly inverting spaced portions of the N type fifth compound semiconductor on the remaining part of the fourth compound semiconductor to spaced P+ type fifth compound semiconductors, (1) the N type third compound semiconductor on the substrate functioning an emitter of an NPN transistor, (2) the remaining part of the fourth compound semiconductor functioning as a base of the NPN transistor, (3) each spaced P+ type fifth compound semiconductor insulating electrons which are transmitted from the substrate to the remaining part of the fourth compound semiconductor through the N type third compound semiconductor, and (4) spaced N type fifth compound semiconductors respectively sandwiched between the spaced P+ type fifth compound semiconductors being formed, and (5) each spaced N type fifth compound semiconductor functioning as a collector of the NPN transistor.

In the above steps, the NPN transistor comprises the emitter made of the third compound semiconductor, the base made of the fourth compound semiconductor, and the collector made of the fifth compound semiconductor. Therefore, the heterojunction type of NPN transistor is fabricated on the substrate on which the heterojunction type of PNP transistor is fabricated.

In addition, the surface of the collector in the NPN transistor is the same height as that of the collector contact layer in the PNP transistor. Therefore, the hardwires can be securely arranged on the compound semiconductor integrated circuit even though the PNP and NPN transistors are fabricated.

The third and fourth objects are achieved by the provision of a heterojunction type of compound semiconductor integrated circuit in which a PNP transistor is fabricated, comprising:

an N type substrate made of a first compound semiconductor for mounting the PNP transistor and for insulating positive holes transmitted in the PNP transistor;

a P type second compound semiconductor limitedly arranged on a part of the substrate for functioning as an emitter of the PNP transistor;

an N type third compound semiconductor arranged on both the second compound semiconductor and the substrate for functioning as a base of the PNP transistor, electrons being applied from the substrate to the third compound semiconductor;

a P type fourth compound semiconductor limitedly arranged on a part of the N type third compound semiconductor,
(1) a part of the fourth compound semiconductor being arranged just above a first part of the second compound semiconductor, and
(2) the part of the fourth compound semiconductor functioning as a collector of the PNP transistor;

a P+ type fifth compound semiconductor limitedly arranged on the part of the fourth compound semiconductor for functioning as a collector contact layer of the PNP transistor;

an emitter contact layer limitedly arranged on a second part of the second compound semiconductor for supplying positive holes to the second compound semiconductor, the surface of the emitter contact layer being the same height as that of the fifth compound semiconductor so as to form a flat surface; and an isolation region sandwiched between the emitter contact layer and the fifth compound semiconductor for electrically isolating the emitter contact layer from both the second P+ type fifth compound semiconductor and the fourth compound semiconductor, the surface of the isolation region being the same height as the flat surface.

In the above configuration, the heterojunction type of PNP transistor made of a plurality of compound semiconductors is fabricated.

In addition, the positive holes cannot be horizontally and directly transmitted from the emitter contact layer to both the fourth compound semiconductor and the second P+ type fifth compound semiconductor because the isolation region is arranged. Therefore, the positive holes are vertically transmitted from the second compound semiconductor to the second P+ type fifth compound semiconductor through the third and fourth compound semiconductors. In addition, because the second P+ type fifth compound semiconductor is arranged just above the second compound semiconductor, the positive holes are efficiently transmitted in a straight line.

Moreover, because the thickness of the third compound semiconductor can be precisely controlled, the base thickness of the PNP transistor is precisely controlled.

Accordingly, operational characteristics in the compound semiconductor integrated circuit such as the current amplification are largely improved as compared with the conventional silicon integrated circuit.

In addition, because the flat surface is formed by the second P+ type fifth compound semiconductors, the isolation region, and the emitter contact layer, hardwires can be securely arranged.

The third and fourth objects are also achieved by adding the configuration as follows:

spaced N type sixth compound semiconductors arranged on the remaining part of the fourth compound semiconductors for respectively functioning as a collector of an NPN transistor,
(1) the surface of the sixth compound semiconductors being the same height as the flat surface,
(2) the remaining part of the fourth compound semiconductor functioning as a base of the NPN transistor, and
(3) the third compound semiconductor just under the remaining part of the fourth compound semiconductor functioning as an emitter of the NPN transistor; and spaced P type seventh compound semiconductors respectively sandwiched between the sixth compound semiconductors for electrically isolating one sixth compound semiconductor from the other sixth compound semiconductors, the surface of the sixth compound semiconductors being the same height as the flat surface.

In the above configuration, the heterojunction type of NPN transistor is fabricated on the substrate on which the heterojunction type of PNP transistor is fabricated.

In addition, the surface of the sixth and seventh compound semiconductors are the same height as the plane surface so that the hard-wires can be securely arranged even though the PNP and NPN transistors are fabricated.

Moreover, the first and second objects are achieved by the provision of a method for manufacturing a heterojunction type of compound semiconductor integrated circuit in which a PNP transistor is fabricated, comprising the steps of:

preparing an N type substrate made of a first compound semiconductor, the substrate insulating positive holes transmitted in the PNP transistor;

depositing a P type second compound semiconductor on the substrate,
(1) the second compound semiconductor being provided with a plurality of openings, and
(2) the second compound semiconductor functioning as an emitter of the PNP transistor;

depositing an N type third compound semiconductor on the second compound semiconductor,
(1) the third compound semiconductor being directly deposited on the substrate through the openings, and
(2) the third compound semiconductor on the second compound semiconductor functioning as a base of the PNP transistor;

strongly inverting the N type third compound semiconductor positioned on a part of the second compound semiconductor to a P+ type third compound semiconductor, the P+ type third compound semiconductor reaching the part of second compound semiconductor from the surface of the third compound semiconductor;

limitedly depositing a P type fourth compound semiconductor on a part of the N type third compound semiconductor, (1) the fourth compound semiconductor being spaced from the P+ type third compound semiconductor, (2) a part of the fourth compound semiconductor being arranged just above the second compound semiconductor, (3) the part of the fourth compound semiconductor functioning as a collector of the PNP transistor, and (4) the remaining part of the fourth compound semiconductor being arranged just above the openings;

depositing an N type fifth compound semiconductor on both the third and fourth compound semiconductors, the P+ type third compound semiconductor being covered by the fifth compound semiconductor;

strongly inverting the N type fifth compound semiconductor covering the P+ type third compound semiconductor to a first P+ type fifth compound semiconductor, (1) the first P+ type fifth compound semiconductor reaching the P+ type third compound semiconductor from the surface of the fifth compound semiconductor, and (2) both the P+ type third compound semiconductor and the first P+ type fifth compound semiconductor functioning as an emitter contact layer of the PNP transistor;

strongly inverting the N type fifth compound semiconductor arranged on the part of the fourth compound semiconductor to a second P+ type fifth compound semiconductor;

damaging the N type fifth compound semiconductor sandwiched between the first P+ type fifth compound semiconductor and the fourth compound semiconductors.

(1) the damaged fifth compound semiconductor reaching the upper portion of the third compound semiconductor, and (2) atomic bonds in the damaged fifth compound semiconductor being cut off; and damaging spaced portions of the second P+ type fifth compound semiconductor, (1) spaced P+ type fifth compound semiconductors being respectively formed between the damaged space portions, (2) atomic bonds in the spaced P+ type fifth compound semiconductors being cut off, (3) each spaced P+ type fifth compound semiconductor functioning as a collector contact layer of the PNP transistor, and (4) a flat surface being formed by the N type fifth compound semiconductor, the first P+ type fifth compound semiconductor, the spaced P+ type fifth compound semiconductors, the damaged fifth compound semiconductor, and the damaged space portions.

In the above steps, a heterojunction type of compound semiconductor integrated circuit is manufactured to achieve the third and fourth object as follows.

That is, to achieve the third and fourth object, a heterojunction type of compound semiconductor integrated circuit in which a PNP transistor is fabricated, comprising:

an N type substrate made of a first compound semiconductor for mounting the PNP transistor and for insulating positive holes transmitted in the PNP transistor;

a P type second compound semiconductor limitedly arranged on a part of the substrate for functioning as an emitter of the PNP transistor;

an N type third compound semiconductor arranged on both the second compound semiconductor and the substrate for functioning as a base of the PNP transistor, electrons being applied from the substrate to the third compound semiconductor;

spaced P type fourth compound semiconductors limitedly arranged just above a first part of the second compound semiconductor, each fourth compound semiconductor functioning as a collector of the PNP transistor:

spaced P+ type fifth compound semiconductors arranged on the spaced P type fourth compound semiconductors for respectively functioning as a collector contact layer of the PNP transistor;

collector isolation regions respectively sandwiched between the spaced P type fourth compound semiconductors and between the spaced P+ type fifth compound semiconductors for electrically isolating the fifth compound semiconductors from one another;

an emitter contact layer limitedly arranged on a second part of the second compound semiconductor for supplying positive holes to the second compound semiconductor, the surface of the emitter contact layer being the same height as that of the fifth compound semiconductors so as to form a flat surface; and an emitter isolation region sandwiched between the emitter contact layer and the fourth compound semiconductor for electrically isolating the emitter contact layer from both the spaced P+ type fifth compound semiconductor and the spaced P type fourth compound semiconductor, the surface of the emitter isolation region being the same height as the flat surface.

In the above configuration, a plurality of collectors are fabricated in the heterojunction type of PNP transistor because the collector isolation regions are respectively arranged between the fourth compound semiconductors.

Moreover, the positive holes are vertically transmitted from the second compound semiconductor to the fourth compound semiconductors because the emitter isolation region is arranged. Therefore, the frequency characteristics in the PNP transistor can be largely improved.

Further, the flat surface is formed by the fifth compound semiconductor, the collector insulation regions, the emitter contact layer, and the emitter insulation region. Therefore, the hard-wires can be securely arranged.

In addition, the greater part of the third compound semiconductor can electrically contact with the second compound semiconductor. Therefore, when the PNP transistor is operated after the electrons are accumulated in the third compound semiconductor by the operation of the NPN transistor, the accumulated electrons are rapidly absorbed in the second compound semiconductor.

Accordingly, the operational characteristics such as the propagation delay time can be shortened in the compound semiconductor integrated circuit.

Further, the first and second objects are achieved by the provision of a method for manufacturing a heterojunction type of compound semiconductor integrated circuit in which a PNP transistor is fabricated, comprising the steps of:

preparing a semi-insulating substrate for mounting the PNP transistor on the substrate;

depositing an N type first compound semiconductor on the substrate for insulating positive holes transmitted in the PNP transistor;

limitedly depositing a P type second compound semiconductor on a first part of the first compound semiconductor, the second compound semiconductor functioning as a collector of the PNP transistor;

depositing an N type third compound semiconductor on both the second compound semiconductor and the first compound semiconductor, the third compound semiconductor on the second compound semiconductor functioning as a base of the PNP transistor;

strongly inverting the N type third compound semiconductor positioned on a first part of the second compound semiconductor to a P+ type third compound semiconductor, the P+ type third compound semiconductor reaching the part of second compound semiconductor from the surface of the third compound semiconductor;

limitedly depositing a P type fourth compound semiconductor on the N type third compound semiconductor, (1) the fourth compound semiconductor being deposited just above a second part of the second compound semiconductor, and (2) the fourth compound semiconductor functioning as an emitter of the PNP transistor;

depositing an N type fifth compound semiconductor on both the third and fourth compound semiconductors, the P+ type third compound semiconductor being covered by the fifth compound semiconductor;

strongly inverting the N type fifth compound semiconductor covering the P+ type third compound semiconductor to a first P+ type fifth compound semiconductor, (1) the first P+ type fifth compound semiconductor reaching the P+ type third compound semiconductor from the surface of the fifth compound semiconductor, and (2) both the P+ type third compound semiconductor and the first P+ type fifth compound semiconductor functioning as a collector contact layer of the PNP transistor;

strongly inverting the N type fifth compound semiconductor arranged on the fourth compound semiconductor to a second P+ type fifth compound semiconductor, the second P+ type fifth compound semiconductor functioning as an emitter contact layer of the PNP transistor;

strongly inverting the N type fifth compound semiconductor arranged just above a third part of the second compound semiconductor to an N+ type fifth compound semiconductor, the N+ type fifth compound semiconductor functioning as a base contact layer of the PNP transistor: and damaging the N type fifth compound semiconductor arranged just above the remaining part of the second compound semiconductor so as to electrically separate the first P+ type fifth compound semiconductor, the second P+ type Fifth compound semiconductor and the N+ type fifth compound semiconductor from one another, (1) the damaged fifth compound semiconductor reaching the upper portion of the third compound semiconductor, (2) atomic bonds in the damaged fifth compound semiconductor being cut off, and (3) a flat surface being formed by the N type fifth compound semiconductor, the first P+ type fifth compound semiconductor, the second P+ type fifth compound semiconductor, the N+ type fifth compound semiconductor, and the damaged fifth compound semiconductor.

In the above steps, the PNP transistor is fabricated. Moreover, the NPN transistor is fabricated by adding the following steps:

depositing a P type sixth compound semiconductor sandwiched between the N type third and fifth compound semiconductors arranged just above a second part of the first compound semiconductor, (1) the N type third compound semiconductor on the second part of the first compound semiconductor functioning as a collector of an NPN transistor, and (2) the sixth compound semiconductor functioning as a base of the NPN transistor;

strongly inverting the N type third and fifth compound semiconductors on a third part of the first compound semiconductor to an N+ type compound semiconductor, the N+ type compound semiconductor functioning as a collector contact layer of the NPN transistor;

strongly inverting the N type fifth compound semiconductor on a part of the sixth compound semiconductor to a third P+ type fifth compound semiconductor, (1) the third P+ type fifth compound semiconductor functioning as a base contact layer of the NPN transistor, and (2) the fifth compound semiconductor on the remaining part of the sixth compound semiconductor functioning as an emitter of the NPN transistor;

damaging the N type fifth compound semiconductor other than the fifth compound semiconductor on the remaining part of the sixth compound semiconductor, (1) the damaged fifth compound semiconductor reaching the upper portion of the third compound semiconductor, and (2) atomic bonds in the damaged fifth compound semiconductor being cut off.

In the above steps, a heterojunction type of compound semiconductor integrated circuit in which the PNP and NPN transistors are fabricated is manufactured to achieve the third and fourth object.

That is, to achieve the third and fourth object, a heterojunction type of compound semiconductor integrated circuit in which a PNP transistor is fabricated, comprising:

a semi-insulating substrate for mounting the PNP transistor;

an N type first compound semiconductor arranged on the semi-insulating substrate for insulating positive holes transmitted in the PNP transistor;

a P type second compound semiconductor limitedly arranged on a first part of the first compound semiconductor for functioning as a collector of the PNP transistor;

a collector contact layer limitedly arranged on a first part of the second compound semiconductor for receiving positive holes from the second compound semiconductor;

an N type third compound semiconductor arranged on both the second compound semiconductor and the first compound semiconductor, the third compound semiconductor on the second compound semiconductor functioning as a base of the PNP transistor;

a P type fourth compound semiconductor arranged on the N type third compound semiconductor, (1) the fourth compound semiconductor being arranged just above a second part of the second compound semiconductor, and (2) the fourth compound semiconductor functioning as an emitter of the PNP transistor;

an emitter contact layer arranged on the fourth compound semiconductor for supplying the positive holes to the fourth compound semiconductor, the surface of the emitter contact layer being the same height as that of the collector contact layer so as to form a flat surface;

a base contact layer arranged just above a third part of the second compound semiconductor for applying a negative voltage to the third compound semiconductor. The surface of the base contact layer being the same height as the flat surface; and isolation regions arranged on the third compound semiconductor for electrically isolating the emitter contact layer, the base contact layer and the collector contact layer from one another, each surface of the isolation regions being the same height as the flat surface.

In the above configuration, the PNP transistor is fabricated. Moreover, the NPN transistor is fabricated by adding the following configuration:

a P type sixth compound semiconductor arranged on the N type third compound semiconductor, (1) the fifth compound semiconductor being interposed between the fourth compound semiconductor and the second part of the first compound semiconductor, (2) the fifth compound semiconductor functioning as a base of an NPN transistor, and (3) the third compound semiconductor on the second part of the first compound semiconductor functioning as a collector of the NPN transistor;

an NPN collector contact layer arranged on the third compound semiconductor for receiving electrons from the third compound semiconductor, (1) the NPN collector contact layer being limitedly arranged just above a third part of the first compound semiconductor, and (2) the surface of the NPN collector contact layer being the same height as the flat surface; an NPN base contact layer limitedly arranged on a part of the fifth compound semiconductor for applying a positive voltage to the sixth compound semiconductor, the surface of the NPN base contact layer being the same height as the flat surface;

an N type sixth compound semiconductor limitedly arranged on the remaining part of the fifth compound semiconductor for functioning as an emitter of the NPN transistor the surface of the sixth compound semiconductor being the same height as the flat surface; and an NPN isolation region sandwiched between the NPN collector contact layer and the fourth compound semiconductor for electrically isolating the NPN collector contact layer from both the sixth compound semiconductor and the NPN base contact layer, the surface of the NPN isolation region being the same height as the flat surface.

In the above configuration, the PNP transistor comprises the collector made of the second compound semiconductor, the base made of the third compound semiconductor, and the emitter made of the fourth compound semiconductor. In addition, the NPN transistor comprises the collector made of the third compound semiconductor, the base made of the sixth compound semiconductor, and the emitter made of the fifth compound semiconductor. Therefore, the heterojunction type of the PNP and NPN transistors are fabricated. Therefore, the operational characteristics such as the current amplification are excellent.

Moreover, the emitter contact layer of the PNP transistor, the emitter of the NPN transistor, the base contact layers of the PNP and NPN transistors, and the collector contact layers of the PNP and NPN transistors are faced to one side of the heterojunction type of compound semiconductor integrated circuit. In addition, all contact layers and the emitter of the NPN transistor have the same height to form the plane surface.

Therefore, hard-wires can be securely connected on the contact layers.

DETAILED DESCRIPTION OF THE PREFERRED EMBODIMENTS

Preferred embodiments of a method for manufacturing a heterojunction type of compound semiconductor integrated circuit according to the present invention are described with reference to drawings. Also, preferred embodiments of a heterojunction type of compound semiconductor integrated circuit according to the present invention are described with reference to drawings.

A first embodiment of a method for manufacturing a heterojunction type of compound semiconductor integrated circuit in which a PNP transistor is arranged at a first section and an NPN transistor is arranged at a second section is described with reference to FIGS. 5, 6, 7, and 8.

Figure 5:
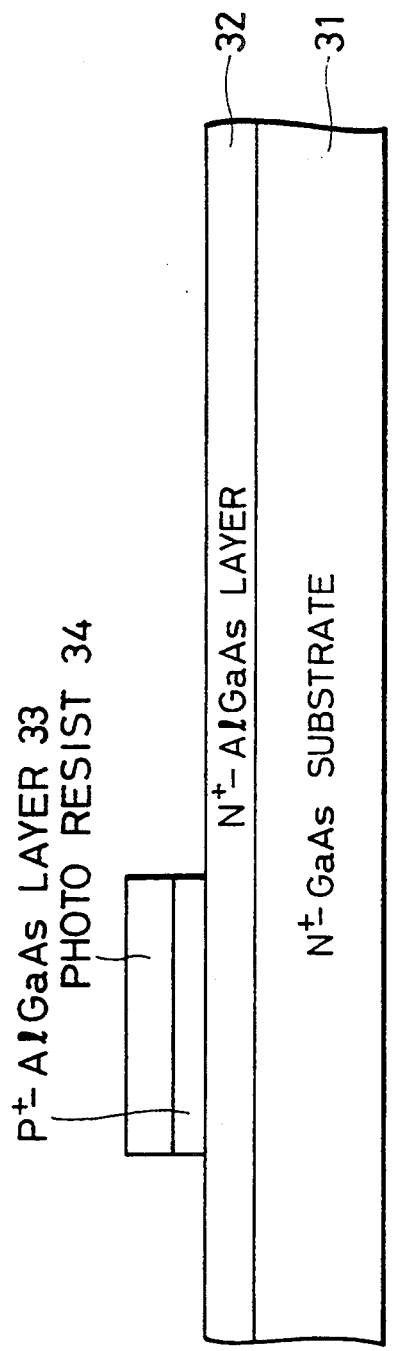
FIG. 5 is a cross sectional view of a heterojunction type of compound semiconductor integrated circuit, showing the starting steps of fabricating an emitter of a vertical PNP transistor in a manufacturing process.
Figure 6:
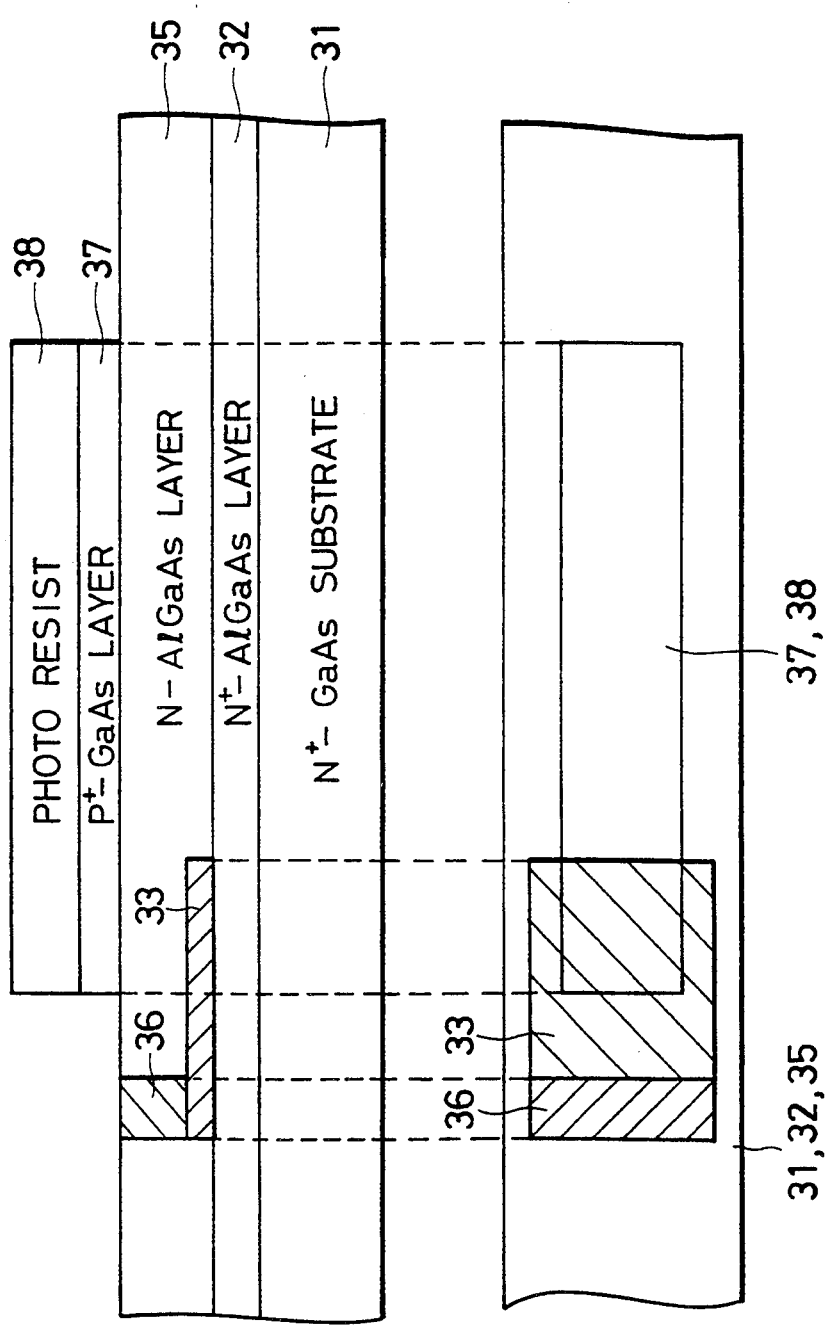
FIG. 6A is a cross sectional view of a heterojunction type of compound semiconductor integrated circuit, showing the middle steps of fabricating bases of vertical PNP and NPN transistors in a manufacturing process.
FIG. 6B is a plan view of the compound semiconductor integrated circuit shown in FIG. 6A.

FIG. 5 is a cross sectional view of a heterojunction type of compound semiconductor integrated circuit, showing the starting steps of fabricating an emitter of a vertical PNP transistor in a manufacturing process.

FIG. 6A is a cross sectional view of a heterojunction type of compound semiconductor integrated circuit, showing the middle steps of fabricating bases of vertical PNP and NPN transistors in a manufacturing process.

FIG. 6B is a plan view of the compound semiconductor integrated circuit shown in FIG. 6A.

Figure 7:
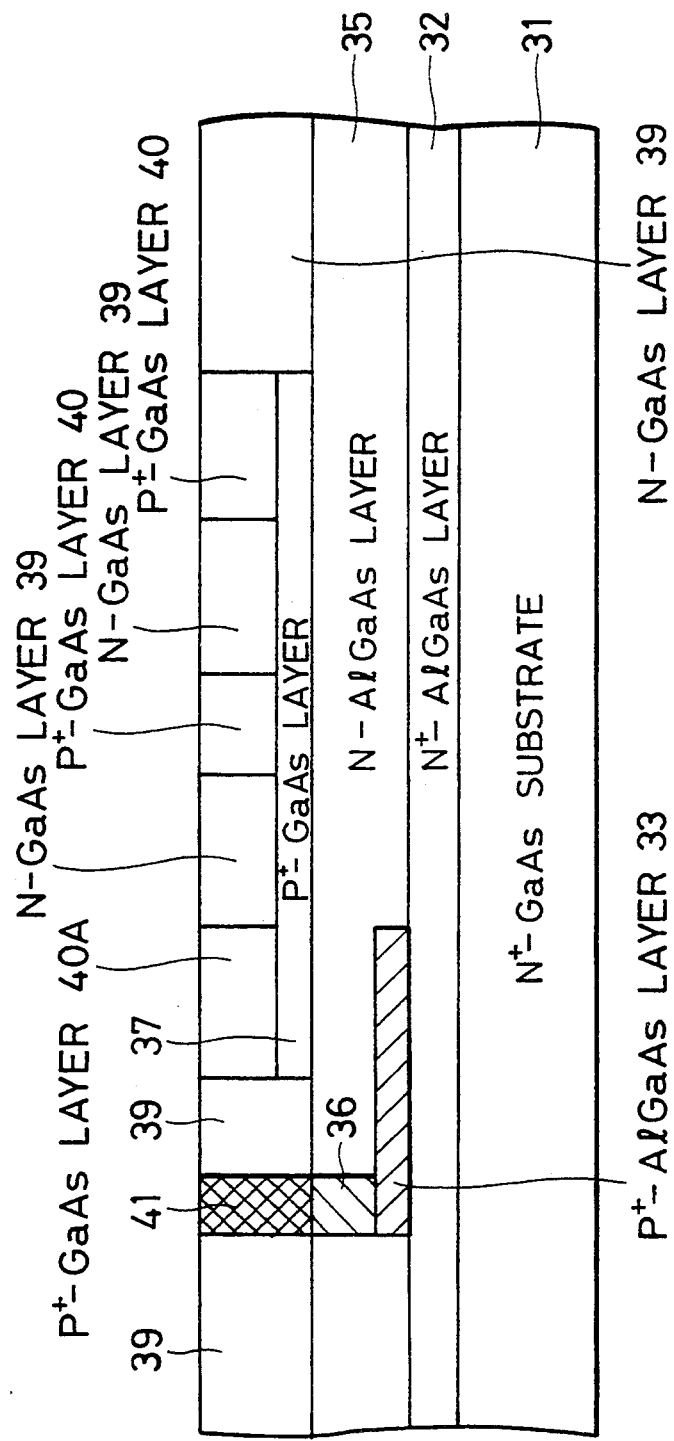
FIG. 7 is a cross sectional view of a heterojunction type of compound semiconductor integrated circuit, showing the final steps of fabricating collectors of vertical PNP and NPN transistors in a manufacturing process.

FIG. 7 is a cross sectional view of a heterojunction type of compound semiconductor integrated circuit, showing the final steps of fabricating collectors of vertical PNP and NPN transistors in a manufacturing process.

Figure 8A:
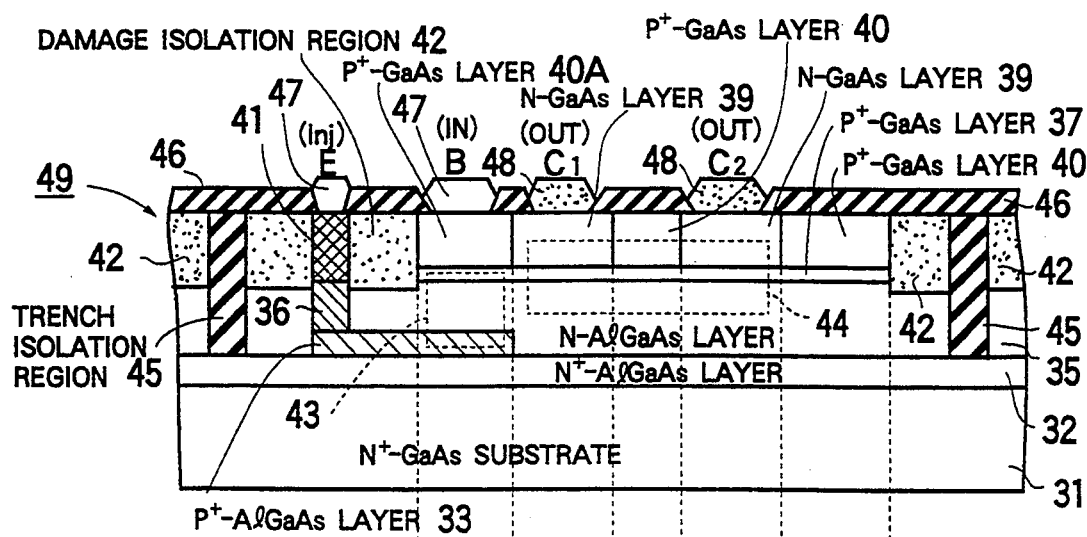
FIG. 8A is a cross sectional view of a heterojunction type of compound semiconductor integrated circuit which is manufactured by the method shown in FIGS. 5, 6A, 6B, and 7.

FIG. 8A is a cross sectional view of a heterojunction type of compound semiconductor integrated circuit which is manufactured by the method shown in FIGS. 5, 6A, 6B, and 7. In addition, FIG. 8A being a sectional view taken generally along the lines A—A' of FIG. 8B.

Figure 8B:
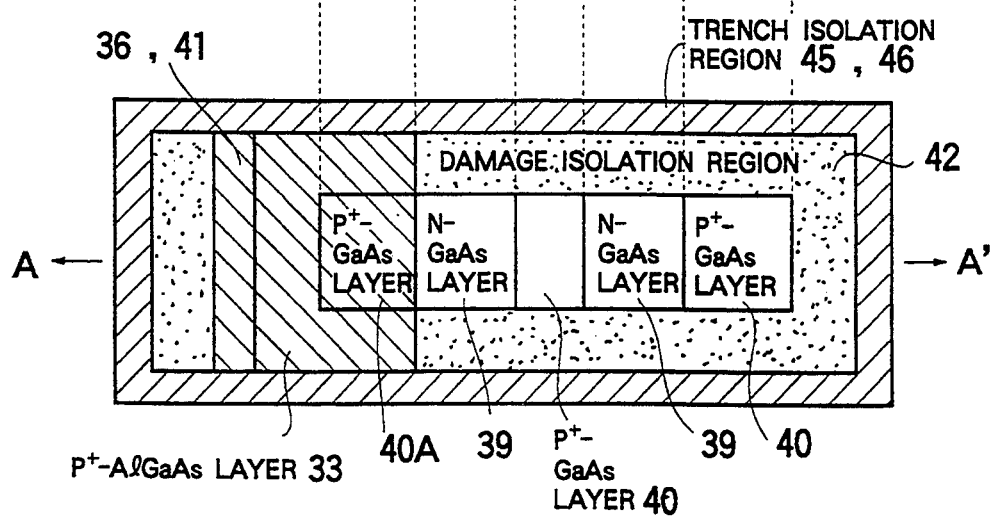
FIG. 8B is a plan view of the compound semiconductor integrated circuit shown in FIG. 8A.

FIG. 8B is a plan view of the compound semiconductor integrated circuit shown in FIG. 8A.

As shown in FIG. 5, an N+ GaAs substrate 31 which is heavily doped in concentrations of $10^{19}$ atms/cm3 by donors is prepared, and an $Al_{0.3}Ga_{0.7}As$ material is deposited on the N+ GaAs substrate 31 at a temperature of approximately 700° C. by utilizing a metal organic chemical vapor deposition (MOCVD) method before the $Al_{0.3}Ga_{0.7}As$ material is heavily doped in concentrations of $10^{19}$ atms/cm3 by the donors to form an N+ $Al_{0.3}Ga_{0.7}As$ layer 32. The N+ $Al_{0.3}Ga_{0.7}As$ 32 has a thickness of 2000 Å.

Thereafter, an $Al_{0.3}Ga_{0.7}As$ material is deposited on the N+ $Al_{0.3}Ga_{0.7}As$ layer 32 at a temperature of approximately 700° C. by utilizing the MOCVD method before the $Al_{0.3}Ga_{0.7}As$ material is heavily doped in concentrations of $10^{19}$ atms/cm3 by acceptors to form a P+ $Al_{0.3}Ga_{0.7}As$ layer 33. The P+ $Al_{0.3}Ga_{0.7}As$ layer 3 has a thickness of 2000 Å and functions as an emitter of the PNP transistor. Thereafter, the P+ $Al_{0.3}Ga_{0.7}As$ layer 33 is coated with a photo resist 34. The photo resist 34 is attached on the P+ $Al_{0.3}Ga_{0.7}As$ layer 33 to draw a prescribed pattern at the first section.

Thereafter, the P+ $Al_{0.3}Ga_{0.7}As$ layer 33 is selectively etched by utilizing the photo resist 34 as a shielding mask. Therefore, the P+ $Al_{0.3}Ga_{0.7}As$ layer 33 etched to draw the prescribed pattern is formed on the N+ $Al_{0.3}Ga_{0.7}As$ layer 32 at the first section. The P+ $Al_{0.3}Ga_{0.7}As$ layer 33 is shaped at a wide rectangle in this embodiment as shown in FIG. 6B. The photo resist 34 is then washed away by a prescribed solution.

Thereafter, as shown in FIG. 6A, an $Al_{0.3}Ga_{0.7}As$ material is deposited on the N+ $Al_{0.3}Ga_{0.7}As$ layer 32 at the second section and is deposited on the P+ $Al_{0.3}Ga_{0.7}As$ layer 33 at the first section at a temperature of approximately 700° C. by utilizing the MOCVD method before the $Al_{0.3}Ga_{0.7}As$ material is doped in concentrations of $10^{17}$ atms/cm$^3$ by donors to form an N Al$_{0.3}$Ga$_{0.7}$As layer 35. The N Al$_{0.3}$Ga$_{0.7}$As layer 35 has a thickness of 6000521. The N Al$_{0.3}$Ga$_{0.7}$As layer 35 on the P+ Al$_{0.3}$Ga$_{0.7}$As layer 33 functions as a base of the PNP transistor, and the N Al$_{0.3}$Ga$_{0.7}$As layer 35 on the N+ Al$_{0.3}$Ga$_{0.7}$As layer 32 functions as an emitter of the NPN transistor. In addition, the thickness of the N Al$_{0.3}$Ga$_{0.7}$As layer 35 is precisely controlled.

Thereafter, the acceptors such as beryllium (Be) ions are selectively implanted in the N Al$_{0.3}$Ga$_{0.7}$As layer 35 on one end of the P+ Al$_{0.3}$Ga$_{0.7}$As layer 33 so that the N Al$_{0.3}$Ga$_{0.7}$As layer 35 implanted with the Be ions is strongly inverted to a P+ Al$_{0.3}$Ga$_{0.7}$As layer 36 connected with the P+ Al$_{0.3}$Ga$_{0.7}$As layer 33. The P+ Al$_{0.3}$Ga$_{0.7}$As layer 36 is shaped as a rectangle in this embodiment as shown in FIG. 6B. Here, the P+ Al$_{0.3}$Ga$_{0.7}$As layer 36 functions as an emitter contact layer of the PNP transistor.

Thereafter, a thin grading layer (not shown) is epitaxially grown on the N Al$_{0.3}$Ga$_{0.7}$As layer 35 by utilizing a molecular beam epitaxy (MBE) method. That is, the composition of the grading layer is gradually shifted from the composition Al$_{0.3}$Ga$_{0.7}$As to the composition GaAs.

Thereafter, a GaAs material is deposited on the thin grading layer by utilizing the MOCVD method before the GaAs material is heavily doped in concentrations of $10^{19}$ atms/cm$^3$ by the acceptors to form a P+ GaAs layer 37. The P+ GaAs layer 37 has a thickness of 1000 Å, and thickness of the P+ GaAs layer 37 is precisely controlled. In this case, because the grading layer is deposited between the N Al$_{0.3}$Ga$_{0.7}$As layer 35 and the P+ GaAs layer 37, a conduction band energy Ec is smoothly shifted between the N Al$_{0.3}$Ga$_{0.7}$As layer 35 and the P+ GaAs layer 37 so that electrons can be easily transmitted from the N Al$_{0.3}$Ga$_{0.7}$As layer 35 to the P+ GaAs layer 37 without trapped in an interface region between the N Al$_{0.3}$Ga$_{0.7}$As layer 35 and the P+ GaAs layer 37.

Thereafter, the P+ GaAs layer 37 is coated with a photo resist 38 in which a prescribed pattern is drawn. Thereafter, the P+ GaAs layer 37 is selectively etched by utilizing the photo resist 38 as a shielding mask. Therefore, the P+ GaAs layer 37 etched to draw the prescribed pattern is formed on the N Al$_{0.3}$Ga$_{0.7}$As layer 35. Here, the P+ GaAs layer 37 arranged just above the P$^0$ Al$_{0.3}$Ga$_{0.7}$As layer 33 functions as a collector of the PNP transistor, and the P+ GaAs layer 37 arranged as the second section functions as a base of the NPN transistor. The P+ GaAs layer 37 is shaped as a narrow rectangle in this embodiment. Specifically, the width of the P+ GaAs layer 37 is narrower than that of the P+ Al$_{0.3}$Ga$_{0.7}$As layer 33 as shown in FIG. 6B. In other words, a part of the P+ GaAs layer 37 is surrounded by the P+ Al$_{0.3}$Ga$_{0.7}$As layer 33 in cases where the P+ Al$_{0.3}$Ga$_{0.7}$As layer 33 and the P+ GaAs layer 37 are shown in FIG. 6B. Therefore, positive holes can be easily transmitted from the P+ Al$_{0.3}$Ga$_{0.7}$As layer 33 to all sides of the P+ GaAs layer 37. The photo resist 38 is then washed away by a prescribed solution. In addition, the P+ GaAs layer 37 is apart from the P+ Al$_{0.3}$Ga$_{0.7}$As layer 36 by a prescribed distance.

Thereafter, as shown in FIG. 7, a GaAs material is deposited on both the P+ GaAs layer 37 and the N Al$_{0.3}$Ga$_{0.7}$As layer 35 at a temperature of approximately 700 ° C. by utilizing the MOCVD method before the GaAs material is doped in concentrations of $10^{17}$ atms/cm$^3$ by the donors to form an N GaAs layer 39.

The N GaAs layer 39 has a thickness of approximately 3000 Å.

Thereafter, Be ions are selectively implanted in spaced portions of the N GaAs layer 39 arranged on the P+ GaAs layer 37 so that the spaced portions of the N GaAs layer 39 implanted with the Be ions are strongly inverted to P+ GaAs layers 40. The P+ GaAs layers 40 are connected with the P+ GaAs layer 37. Also, the N GaAs layer 39 and the P+ GaAs layer 40 are alternately arranged on the P+ GaAs layer 37 in parallel. Specially, one specific P+ GaAs layer 40A among the P+ GaAs layer 40 is arranged just above The P+ Al$_{0.3}$Ga$_{0.7}$As layer 33, and the N GaAs layers 39 on the P+ GaAs layer 37 are not arranged above the P+ Al$_{0.3}$Ga$_{0.7}$As layer 33. The specific P+ GaAs layer 40A functions as a collector contact layer of the PNP transistor, and the N GaAs layers 39 function as a collector of the NPN transistor. Therefore, the positive holes can be easily transmitted from the P+ Al$_{0.3}$Ga$_{0.7}$As layer 33 to all sides of the specific P+ GaAs layer 40A through the P+ GaAs layer 37.

In the same time, Be ions are implanted in concentrations of $10^{19}$ atms/cm$^3$ into the N GaAs layer 39 positioned on the P+ Al$_{0.3}$Ga$_{0.7}$As layer 36. Therefore, the N GaAs layer 39 implanted with the Be ions are strongly inverted to a P+ GaAs layer 41. That is, the positive holes applied to the P+ GaAs layer 41 can be easily transmitted no the P+ Al$_{0.3}$Ga$_{0.7}$As layer 33 through the P+ Al$_{0.3}$Ga$_{0.7}$As layer 36 because the layers 33, 36, and 41 are heavily doped to increase the electric conductivity.

Thereafter, a photo resist (not shown) is coated on both the P+ GaAs layer 40 and parts of the N GaAs layers 39 which are deposited on the P+ GaAs layer 37. Thereafter, H$^{30}$ ions or B+ ions are implanted to the N GaAs layers 39 positioned on the N Al$_{0.3}$Ga$_{0.7}$As layer 35. In this case, the H+ ions or B+ ions cannot transmitted through the photo resist. Therefore, the H+ ions or B+ ions are not implanted into the P+ GaAs layer 40 and the N GaAs layers 39 deposited on the P+ GaAs layer 37 because the layers 39, 40 is coated with the photo resist. The photo resist is then washed away by a prescribed solution.

As a result, as shown in FIG. 8A, the N GaAs layers 39 positioned on the N Al$_{0.3}$Ga$_{0.7}$As layer 35 and the upper portion of the N Al$_{0.3}$Ga$_{0.7}$As layer 35 are damaged to form damage isolation regions 42. In detail, a large number of atomic bonds between the atoms Al, Ga, and As are cut off in the layers 35, 39 so that a large number of levels for trapping the electrons and the positive holes are generated. Therefore, the electrons and the positive holes supplied to the damage isolation regions 42 are rapidly trapped so that the N GaAs layers 39 positioned on the N Al$_{0.3}$Ga$_{0.7}$As layer 35 and the upper portions of the N Al$_{0.3}$Ga$_{0.7}$As layer 35 are strongly inverted to semi-insulating materials.

Therefore, the positive holes can be not transmitted from the P+ GaAs layer 41 or the P+ Al$_{0.3}$Ga$_{0.7}$As layer 36 to the P+ GaAs layer 37 or the specific P+ GaAs layer 40A. That is, a horizontal PNP transistor is not fabricated, while the horizontal PNP transistor 24 is parasitically fabricated in the conventional silicon IIL circuit 21.

In the above steps, a vertical PNP transistor 43 comprises the P+ Al$_{0.3}$Ga$_{0.7}$As layer 33 for functioning as the emitter, the N Al$_{0.3}$Ga$_{0.7}$As layer 35 for functioning as the base, and the P+ GaAs layer 37 for functioning as the collector. In addition, a vertical NPN transistor 44 comprises the N Al$_{0.3}$Ga$_{0.7}$As layer 35 for functioning as the emitter, the P+ GaAs layer 37 for functioning as the base, and the N GaAs layers 39 for functioning as the collector. In this case, the P+ GaAs layers 40 other than the specific P+ GaAs layer 40A function as insulators for the N GaAs layers 39 because the electrons cannot pass through the P+ GaAs layer 40.

Thereafter, a photo resist (not shown) is coated on a circuit region occupied by the P+ GaAs layer 41 the vertical PNP transistor 43, the vertical NPN transistor 44, and the damage isolation regions 42 surrounding the transistors 43, 44. Thereafter, argon (Ar) ions are radiated on the damage isolation regions 42 arranged at a periphery of the circuit region by an Ar ion milling method so that a trench reaching the N Al$_{0.3}$Ga$_{0.7}$As layer 35 is digged around the circuit region. In this case, the layers 39, 40, and 41 are not trenched because the Ar ions cannot penetrate the photo resist. In addition, the trench digged around the circuit region has a flat-shaped bottom. Therefore, the stress generated in the bottom of the trench is dispersed so that no adverse influence is generated by trenching the damage isolation regions 42. The photo resist is then washed away by a prescribed solution.

Thereafter, a Si$_3$N$_4$ material is deposited into the trench to fabricate a trench isolation region 45. Moreover, the Si$_3$N$_4$ material is deposited on the circuit region so that a Si$_3$N$_4$ film 46 is formed over the entire circuit region. Here, the Si$_3$N$_4$ material is an insulator. Therefore, as shown in FIG. 8B, the circuit region provided with the vertical PNP transistor 43 and the vertical NPN transistor 44 is surrounded by the trench isolation region 45 so that the circuit region is isolated from the other circuit regions which are arranged on the same N+ Al$_{0.3}$Ga$_{0.7}$As 32.

Thereafter, the Si$_3$N$_4$ film 46 is selectively etched to form contact holes on the N GaAs layers 39, the P+ GaAs layer 41, and the specific P+ GaAs layer 40A. The contact holes on both the P+ GaAs layer 41 and the specific P+ GaAs layer 40A are buried by an ohmic metal such as AuZn so than AuZn electrodes 47 are formed on both the P+ GaAs layer 41 and the specific P+ GaAs layer 40A. In addition, the contact holes on the N GaAs layers 39 are buried by a schottky metal such as TiPtAu so that TiPtAu electrodes 48 are formed on the N GaAs layers 39. The schottky metal is utilized because the N GaAs layers 39 are not heavily doped. Thereafter, The AuZn and TiPtAu electrodes 47, 48 are alloyed at a foaming gas atmosphere by a rapid thermal anneal (RTA) method. Therefore, the electrons transmitted to the N GaAs layers 39 from an electrode connected with the N+ GaAs layer 31 are efficiently transmitted to the TiPtAu electrode 48 because the electrode 48 is made of the schottky metal.

Thereafter, hard-wires are connected with the AuZn and TiPtAu electrodes 47, 48. In brief, a SiO$_2$ film is deposited on the AuZn and TiPtAu electrodes 47, 48 and the Si$_3$N$_4$ film 46. Thereafter, the SiO$_2$ film on the AuZn and TiPtAu electrodes 47, 48 is selectively etched off before a barrier metal is selectively deposited on the AuZn and TiPtAu electrodes 47, 48. Thereafter, a TiWAu film is deposited on the SiO$_2$ film and the barrier metal by an etching method before the TiWAu film is selectively etched off by the ion milling method to form the hard-wires according to a prescribed wiring pattern. That is, the hard-wires made of the TiWAu film are electrically connected with the AuZn and TiPtAu electrodes 47, 48 through the barrier metal. The barrier metal does not react on the electrons and the positive holes, while the metals such as Ti, Pt, and Au react on the electrons and the positive holes. Therefore, the hard-wires do not deteriorate even though the circuit shown in FIG. 8A is operated for a long time.

In this embodiment, the hard-wire connected with AuZn electrode 47 on the P+ GaAs 41 layer is connected with an injector to always apply a positive high voltage to the electrode 47. The hard-wire connected with the AuZn electrode 47 on the P+ GaAs 40A layer is connected with an input terminal. And, the hard-wires connected with the TiPtAu electrodes 48 on the N GaAs layers are connected with output terminals C1, C2.

Therefore, a heterojunction type of compound semiconductor integrated circuit 49 is manufactured by a method comprising the above steps and functions as the IIL circuit.

Figure 1:
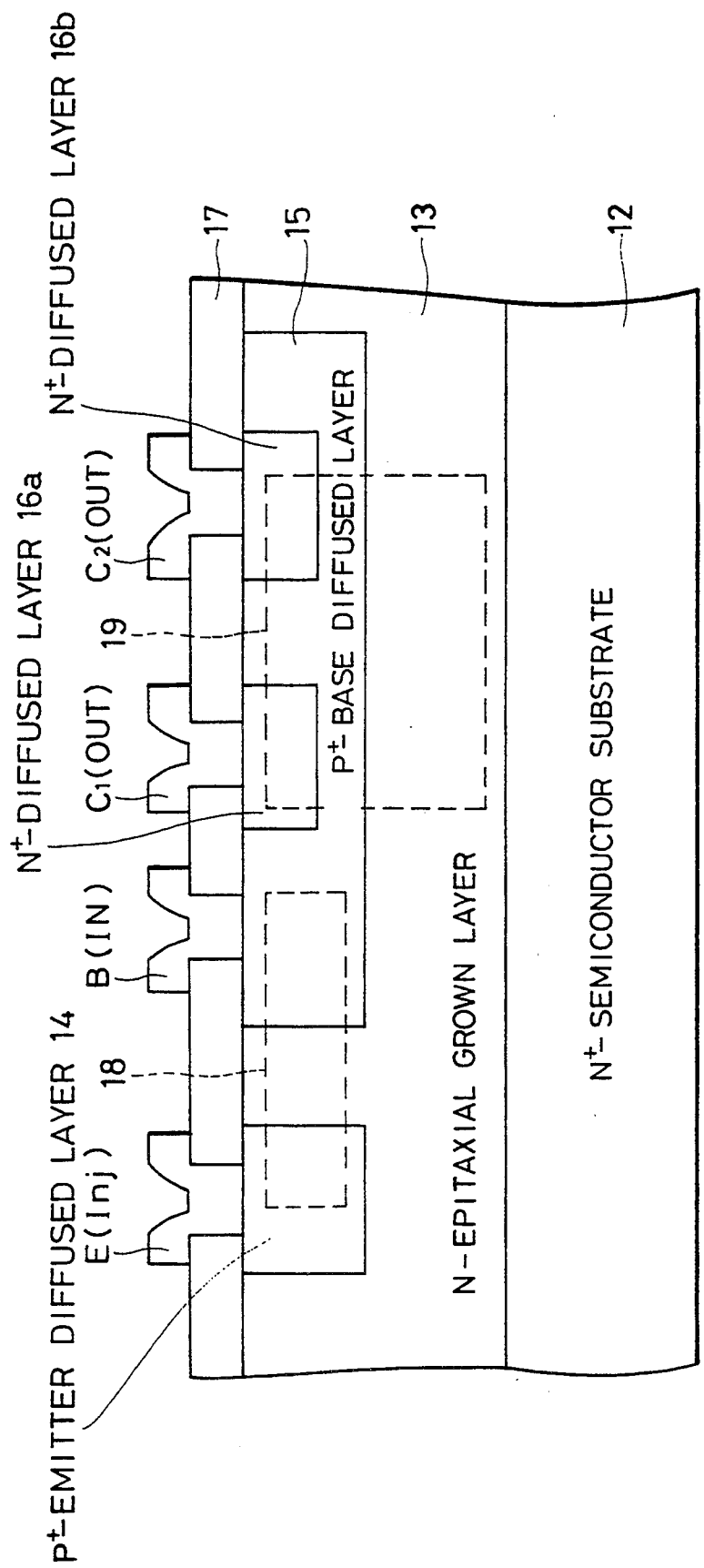
FIG. 1 is a cross sectional view of a conventional silicon IIL circuit.
Figure 2:
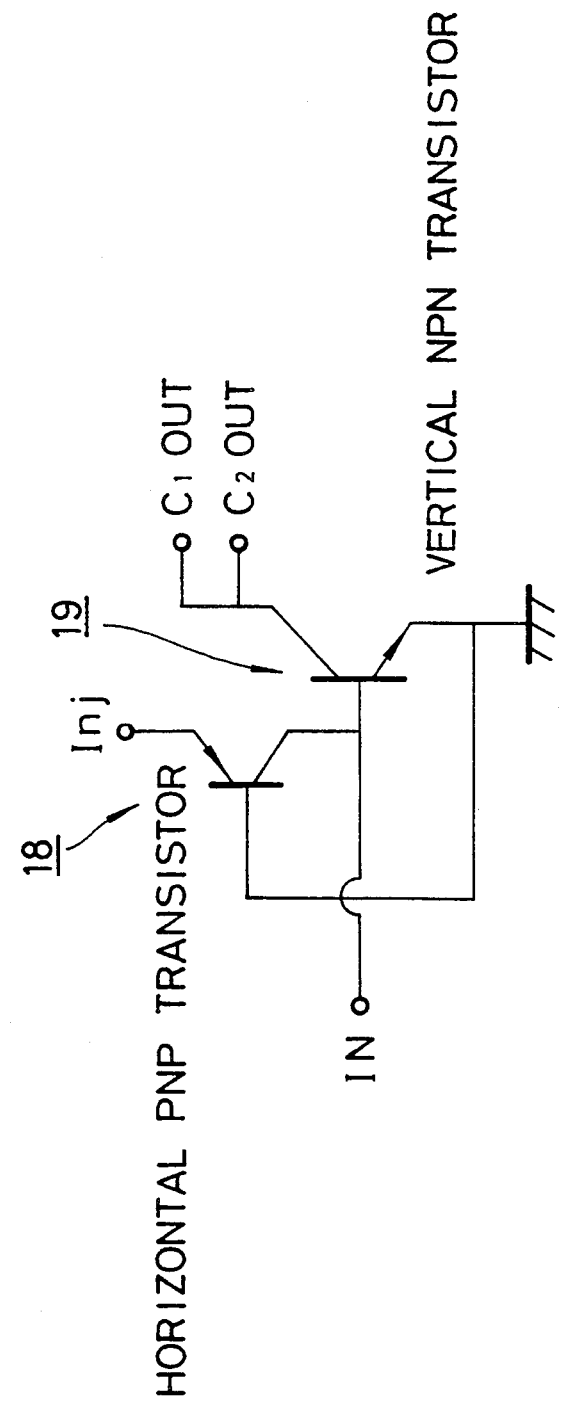
FIG. 2 is an equivalent circuit of the IIL shown in FIG. 1.
Figure 3:
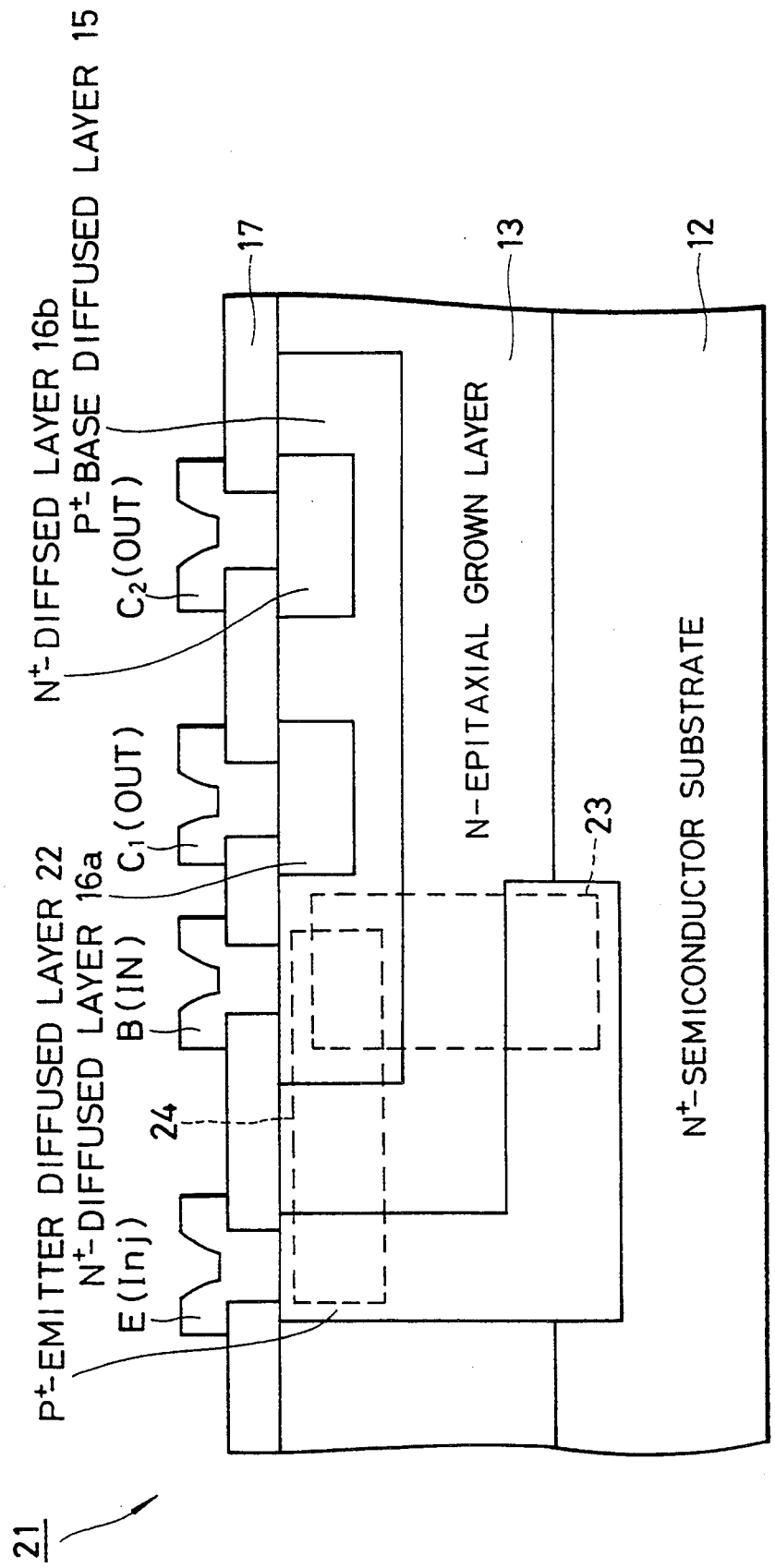
FIG. 3 is a cross sectional view of another conventional silicon IIL circuit in which frequency characteristics and propagation delay time are improved.
Figure 4:
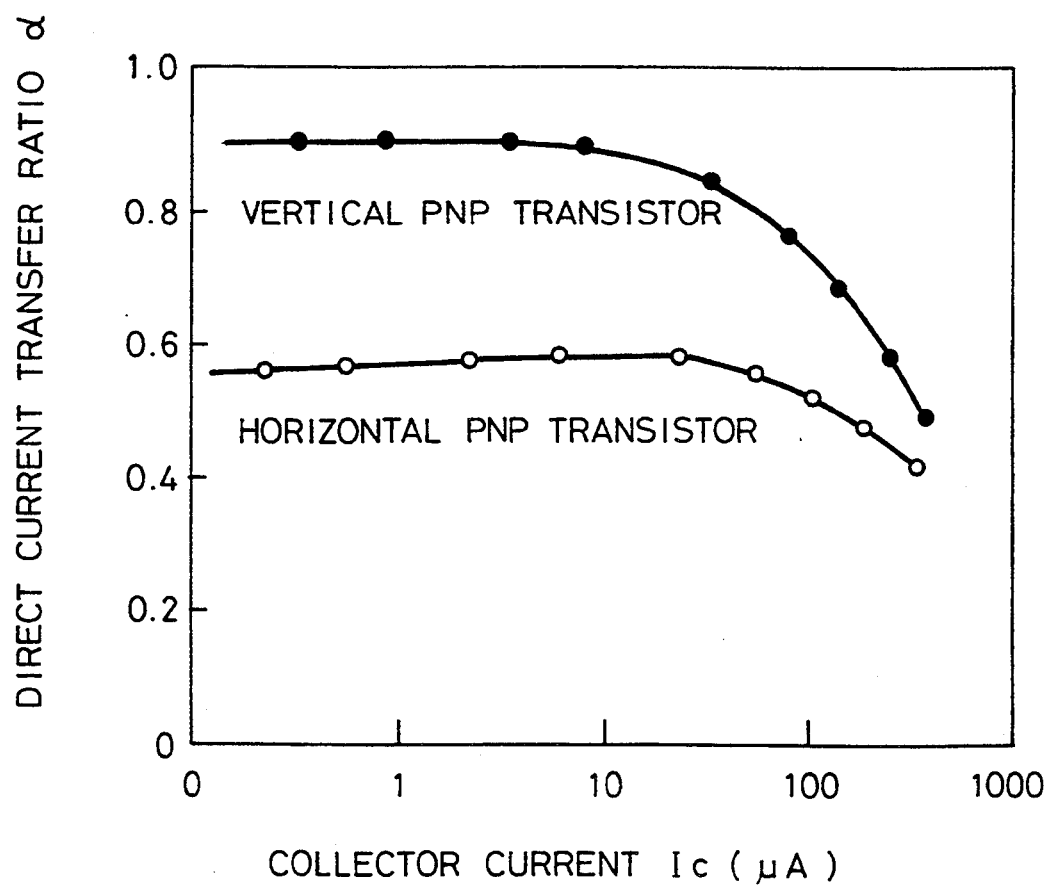
FIG. 4 is a graphic view showing the relation between a collector current Ic and a direct current transfer ratio $\alpha$ at grounded base.

Accordingly, because both the emitter and the base in the vertical PNP transistor 43 are made of an AlGaAs compound semiconductor and the collector in the vertical PNP transistor 43 is made of a GaAs compound semiconductor, the vertical PNP transistor 43 has a heterostructure. In the same manner, because the emitter in the vertical NPN transistor 44 is made of the AlGaAs compound semiconductor and both the base and the collector in the vertical NPN transistor 44 are made of the GaAs compound semiconductor, the vertical NPN transistor 44 has a heterostructure. Therefore, the frequency characteristics can be excellent as compared with the IIL circuits 11, 21 shown in FIGS. 2, 3.

In addition, because the transmission of the positive holes from the P+ GaAs layer 41 to the P+ GaAs layers 37, 40 is interrupted by the damage isolation region 42, no horizontal PNP transistor is parasitically generated. Therefore, the positive holes are vertically transmitted from the P+ Al$_{0.3}$Ga$_{0.7}$As layer 33 to the P+ GaAs layers 37, 40 in the vertical PNP transistor 43. In addition, because the thickness of the N AlGaAs 35 is precisely controlled, the base thickness of the vertical PNP transistor 43 is precisely controlled.

Figure 9:
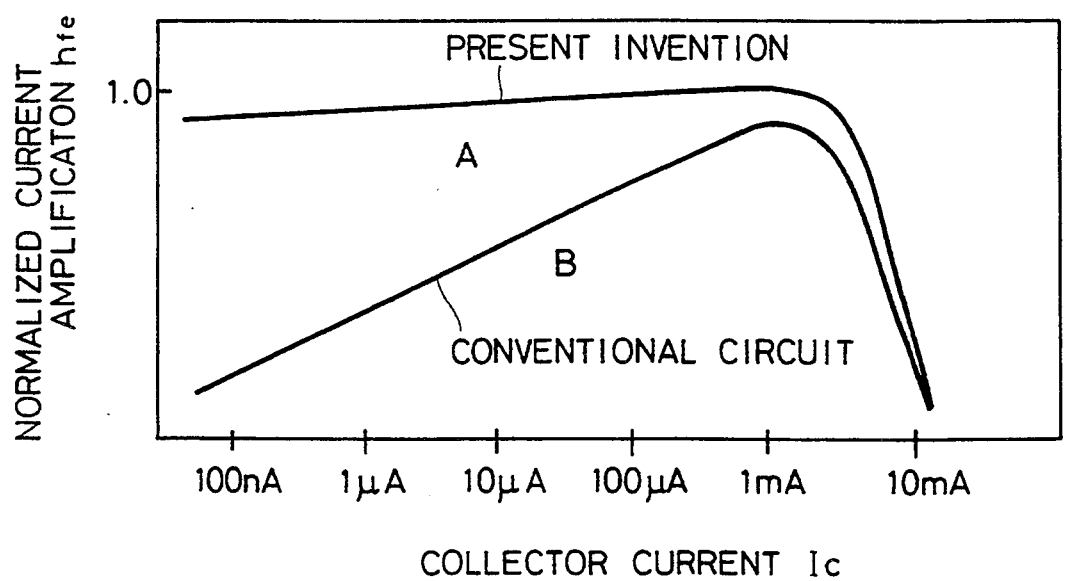
FIG. 9 is a graphic view showing the relation between a collector current Ic and a normalized current amplification $f_e$ in the compound semiconductor integrated circuit shown in FIG. 8A and a conventional silicon integrated circuit.

Accordingly, direct current characteristics are largely improved as compared with the conventional silicon IIL circuit 21 even though the amount of the positive holes transmitting through the the P+ GaAs layer 40 is low. Moreover, as shown in FIG. 9, the current amplification factor h$_{fe}$ in the IIL circuit 49 according to the present invention is excellent even though the collector current Ic is low. Further, the value of the current amplification factor h$_{fe}$ is the same as that in the conventional silicon IIL circuit 21 even though the IIL circuit 49 is made of the compound semiconductors.

Also, because the IIL circuit 49 has the heterostructure so that alternating current characteristics are excellent.

Moreover, because a part of the P+ GaAs layer 37 is surrounded by the P+ Al$_{0.3}$Ga$_{0.7}$As layer 33 in a plan view as shown in FIG. 8B, the positive holes can be easily transmitted from the P+ Al$_{0.3}$Ga$_{0.7}$As layer 33 to all sides of the P+ GaAs layer 37.

Moreover, because the IIL circuit 49 is surrounded by the trench isolation region 45, the IIL circuit 49 can be reliably insulated from the other circuits adjacent to the IIL circuit 49. In addition, the other circuits including the IIL circuit 49 can share both the N+ GaAs substrate 31 and the N+ Al$_{0.3}$Ga$_{0.7}$As layer 32. Therefore, large scaled integrated circuits can be easily manufactured.

Moreover, because the TiPtAu electrodes 48 are the schottky metal, the switching speed in the vertical NPN transistor 44 is excellent.

Also, because both the P+ AlGaAs layer 36 and the P+ GaAs layer 41 are arranged to connect with the P+ AlGaAs layer 33, the electrodes 47, 48 can be arranged at the same height. In other words, the IIL circuit 49 is nor a mesa type but a planar type. Therefore, the hard-wires are securely connected with one another.

In this embodiment, the compound semiconductor $Al_{0.3}Ga_{0.7}As$ is utilized. However, the composition of the AlGaAs is not limited to the composition $Al_{0.3}Ga_{0.7}As$. That is, the composition $Al_xGa_{1-x}As$ $(0<X<1)$ is available. Moreover, it is preferable that the composition of the AlGaAs layers differ from one another.

In addition, it is preferable that the substrate be made of an InP type of compound semiconductor.

Next, a second embodiment is described with reference to FIG. 10.

Figure 10:
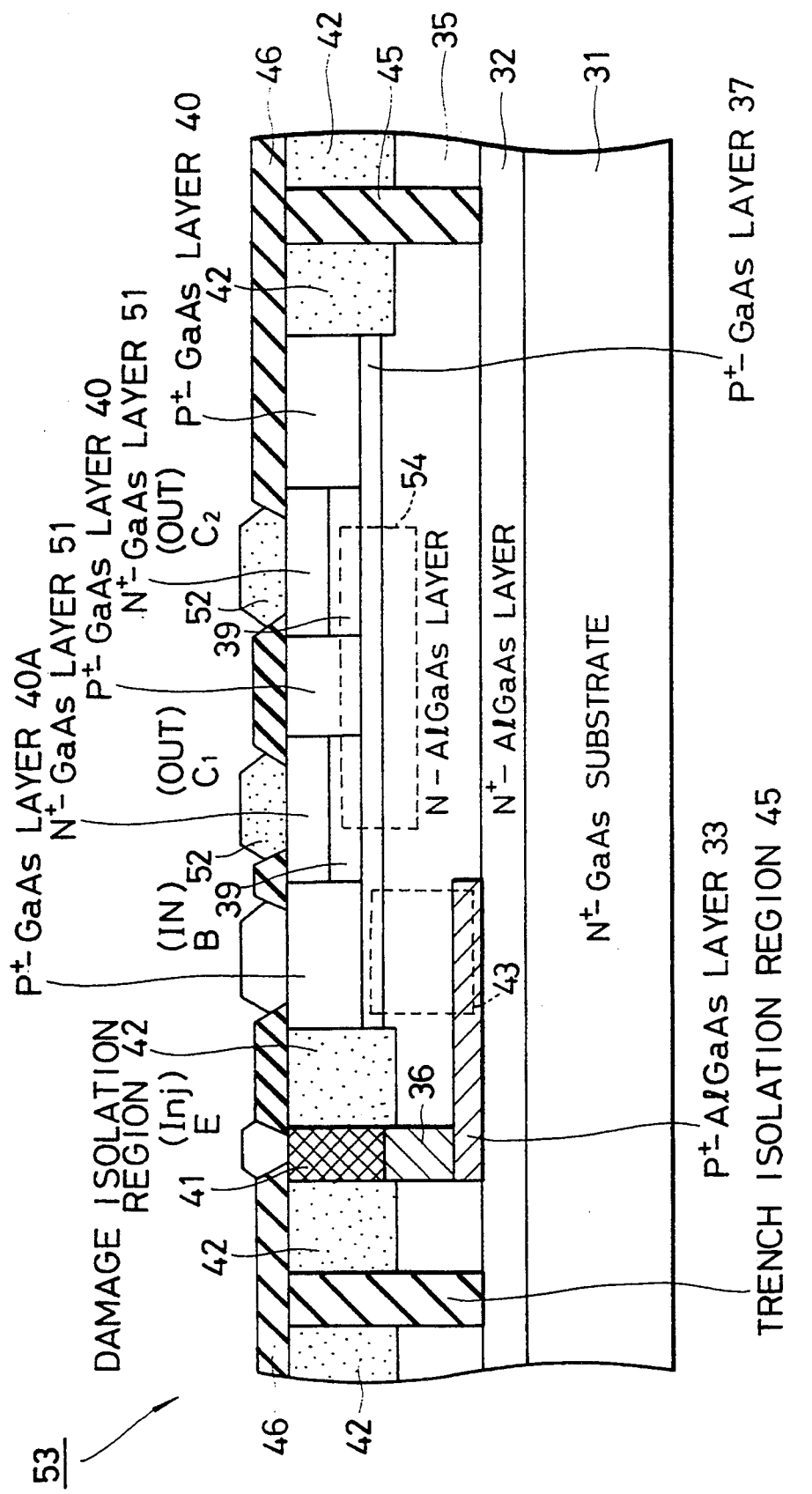
FIG. 10 is a cross sectional view of another heterojunction type of compound semiconductor integrated circuit according to a second embodiment.

FIG. 10 is a cross sectional view of another heterojunction type of compound semiconductor integrated circuit according to a second embodiment.

As shown in FIG. 10, the upper portion of each N GaAs layer 39 fabricated according to the first embodiment is strongly inverted to an N+ GaAs layer 51 by heavily implanting the donors into the upper portion of each P+ GaAs layer 40. Therefore, the ohmic resistance of the N+ GaAs layer 51 is largely smaller than that of the P+ GaAs layer 40. Thereafter, the P+ GaAs layer 41, the damage isolation regions 42, the trench isolation region 45, and the etched $Si_3N_4$ film 46 are fabricated in the same manner as in the first embodiment.

Thereafter, an ohmic metal such as AuGeNi is deposited on the N+ GaAs layers 51 to fabricate AuGeNi electrodes 52. In the second embodiment, because the ohmic resistance of the N+ GaAs layer 51 is largely smaller than that of the N GaAs layer 39, the electrons transmitted to the N+ GaAs layers 51 can be easily transmitted to the AuGeNi electrodes 52 without utilizing the schottky metal such as TiPtAu utilized in the first embodiment.

Thereafter, the other electrodes and the hard-wires are fabricated in the same manner as in the first embodiment.

As a result, a heterojunction type of compound semiconductor integrated circuit 53 provided with the vertical PNP transistor 43 and a vertical NPN transistor 54 is manufactured according to the second embodiment.

Accordingly, because the schottky metal such as TiPtAu is expensive, the compound semiconductor integrated circuit 53 can be manufactured economically.

The present invention embodied by the second embodiment is claimed at the claim 5.

Next, a third embodiment is described with reference to FIGS. 11A, 11B.

Figure 11A:
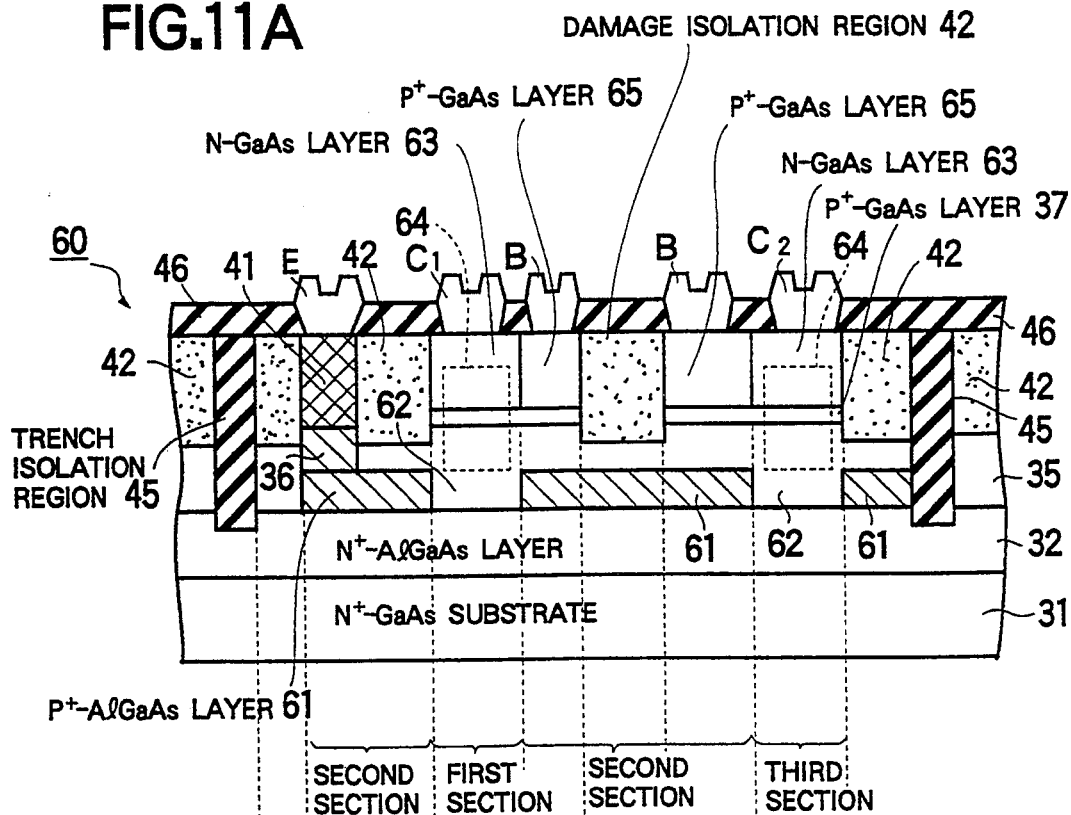
FIG. 11A is a cross sectional view of a heterojunction type of compound semiconductor integrated circuit according to a third embodiment.

FIG. 11A is a cross sectional view of a heterojunction type of compound semiconductor integrated circuit 60 according to a third embodiment. In addition, FIG. 11A being a sectional view taken generally along the lines A—A' of FIG. 11B.

Figure 11B:
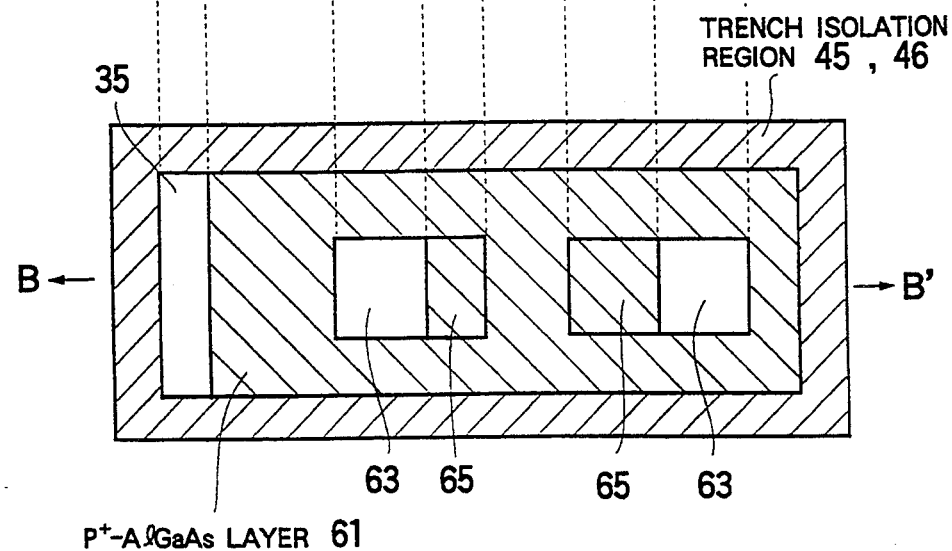
FIG. 11B is a plan view of the compound semiconductor integrated circuit shown in FIG. 11A.

FIG. 11B is a plan view of the compound semiconductor integrated circuit shown in FIG. 11A.

As shown in FIG. 11A, a heterojunction type of compound semiconductor integrated circuit 60 in which NPN transistors arranged at first and third sections and a PNP transistor arranged at a second section is manufactured according to the third embodiment.

In detail, the circuit 60 is provided with a P+ $Al_{0.3}Ga_{0.7}As$ layer 61 in place of the P+ $Al_{0.3}Ga_{0.7}As$ layer 33 provided in the first embodiment.

The P+ $Al_{0.3}Ga_{0.7}As$ layer 61 is deposited over the entire N+ $Al_{0.3}Ga_{0.7}As$ layer 32 except in enclosed openings 62 provided at the first and second sections as shown in FIG. 11B.

The compound semiconductor integrated circuit 60 is also provided with N GaAs layers 63 on the P GaAs layer 37 in place of the N GaAs layers 39 provided in the first embodiment.

The N GaAs layers 63 are arranged just above the enclosed openings 62 so that the electrons supplied from the N+ $Al_{0.3}Ga_{0.7}As$ layer 32 are transmitted to the N GaAs layers 63 through the enclosed openings 62 in a straight line. That is, vertical NPN transistors 64 are fabricated at the first and third sections.

The compound semiconductor integrated circuit 60 is also provided with P+ GaAs layers 65 on the P GaAs layer 37 in place of the specific P+ GaAs layers 40A provided in the first embodiment.

The P+ GaAs layers 65 are isolated from each other by the damage isolation region 42 and are arranged just above the P+ $Al_{0.3}Ga_{0.7}As$ layer 61. Therefore, the positive holes supplied to the P+ $Al_{0.3}Ga_{0.7}As$ layer 61 are transmitted to the P+ GaAs layers 65 through the N $Al_{0.3}Ga_{0.7}As$ layer 35 in a straight line. That is, vertical PNP transistors 66 are fabricated at the second section.

The other layers and regions in the compound semiconductor integrated circuit 60 are arranged in the same manner as in the first embodiment.

In the above configuration of the compound semiconductor integrated circuit 60, the electrons are accumulated in the N $Al_{0.3}Ga_{0.7}As$ layer 35 during the operation of the vertical NPN transistors 64. Thereafter, when the vertical NPN transistors 64 are turned off and the vertical PNP transistors 66 are turned on, the accumulated electrons in the N $Al_{0.3}Ga_{0.7}As$ layer 35 are rapidly absorbed in the P+ $Al_{0.3}Ga_{0.7}As$ layer 61 because the greater part of the surface of the N $Al_{0.3}Ga_{0.7}As$ layer 35 is contacted with the P+ $Al_{0.3}Ga_{0.7}As$ layer 61 of which the surface is larger than that of the P+ $Al_{0.3}Ga_{0.7}As$ layer 33 in the first embodiment. Therefore, the positive holes can be rapidly transmitted from the P+ $Al_{0.3}Ga_{0.7}As$ layer 61 to the P+ GaAs layers 65 without recombining with the electrons in the N $Al_{0.3}Ga_{0.7}As$ layer 35.

Accordingly, the propagation delay time is largely decreased in the compound semiconductor integrated circuit 60 as compared with the compound semiconductor integrated circuit 49.

Moreover, because the N GaAs layers 63 is not arranged above the P+ $Al_{0.3}Ga_{0.7}As$ layer 61, a thyristor comprising the P+ $Al_{0.3}Ga_{0.7}As$ layer 61, the N $Al_{0.3}Ga_{0.7}As$ layer 35, the P GaAs layer 37, and the N GaAs layers 63 does not function.

Accordingly, the operational characteristics such as the current amplification are excellent in the same manner as in the first embodiment.

Next, a fourth embodiment is described with reference to FIGS. 12 to 16. That is, a vertical PNP transistor arranged in a first section and a vertical NPN transistor arranged in a second section are fabricated on a substrate.

Figure 12:
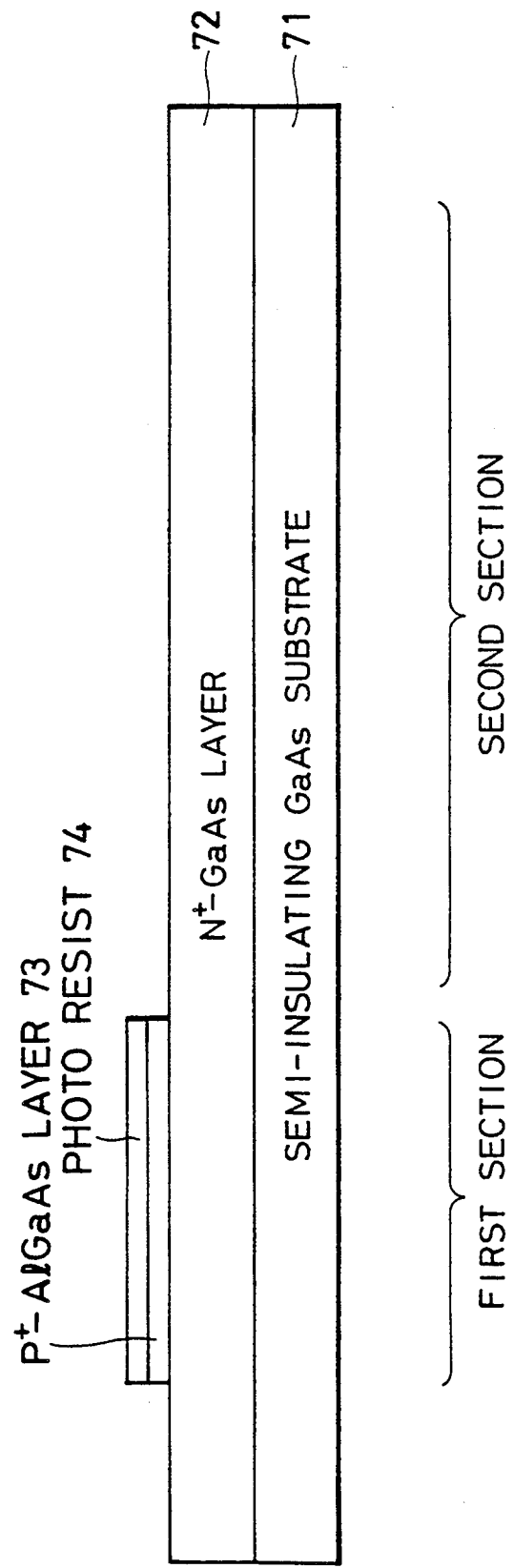
FIG. 12 is a cross sectional view of a heterojunction type of compound semiconductor integrated circuit according to the fourth embodiment, showing the starting steps of fabricating an emitter of a vertical PNP transistor in a manufacturing process.

FIG. 12 is a cross sectional view of a heterojunction type of compound semiconductor integrated circuit according to the fourth embodiment, showing the starting steps of fabricating an emitter of a vertical PNP transistor in a manufacturing process.

Figure 13:
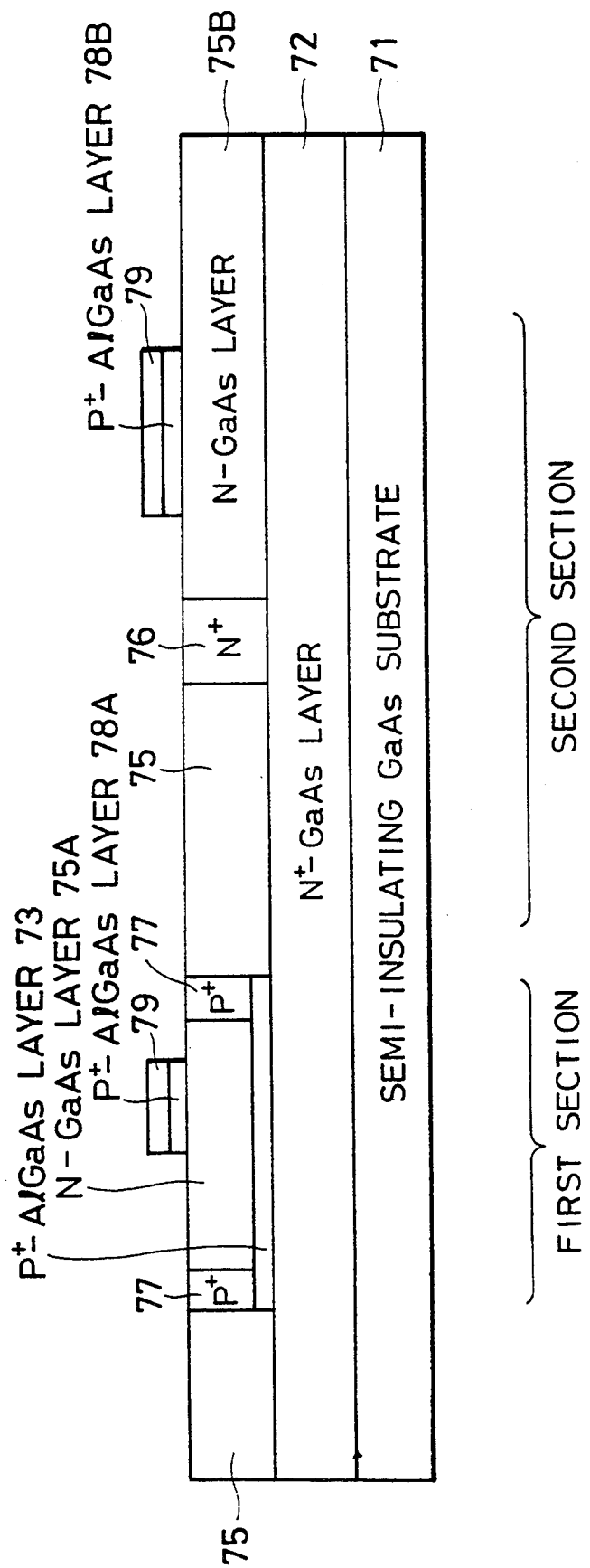
FIG. 13 is a cross sectional view of a heterojunction type of compound semiconductor integrated circuit according to the fourth embodiment, showing the first middle steps of fabricating bases of vertical PNP and NPN transistors in a manufacturing process.

FIG. 13 is a cross sectional view of a heterojunction type of compound semiconductor integrated circuit according to the fourth embodiment, showing the first middle steps of fabricating bases of vertical PNP and NPN transistors in a manufacturing process.

Figure 14:
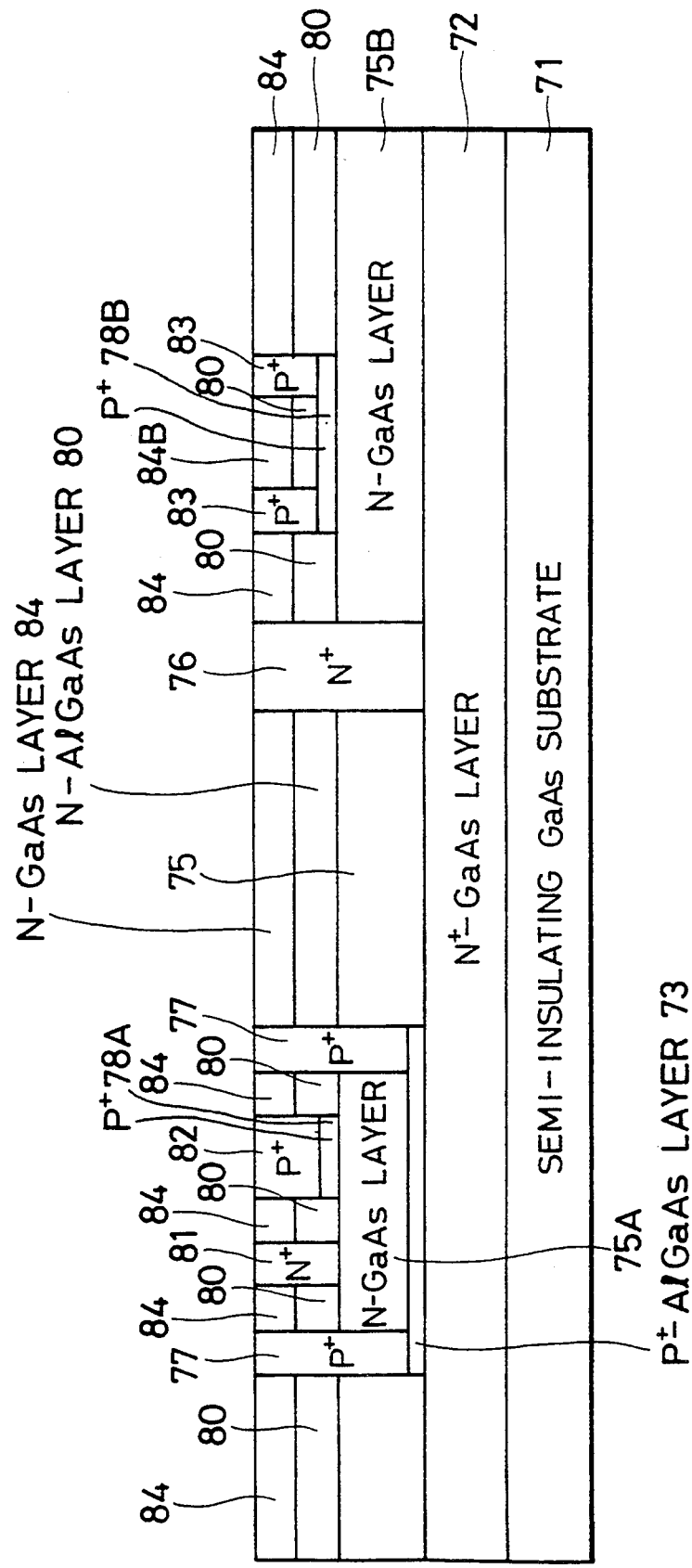
FIG. 14 is a cross sectional view of a heterojunction type of compound semiconductor integrated circuit according to the fourth embodiment, showing the second middle steps of fabricating collectors of vertical PNP and NPN transistors in a manufacturing process.

FIG. 14 is a cross sectional view of a heterojunction type of compound semiconductor integrated circuit according to the fourth embodiment, showing the second middle steps of fabricating collectors of vertical PNP and NPN transistors in a manufacturing process.

Figure 15:
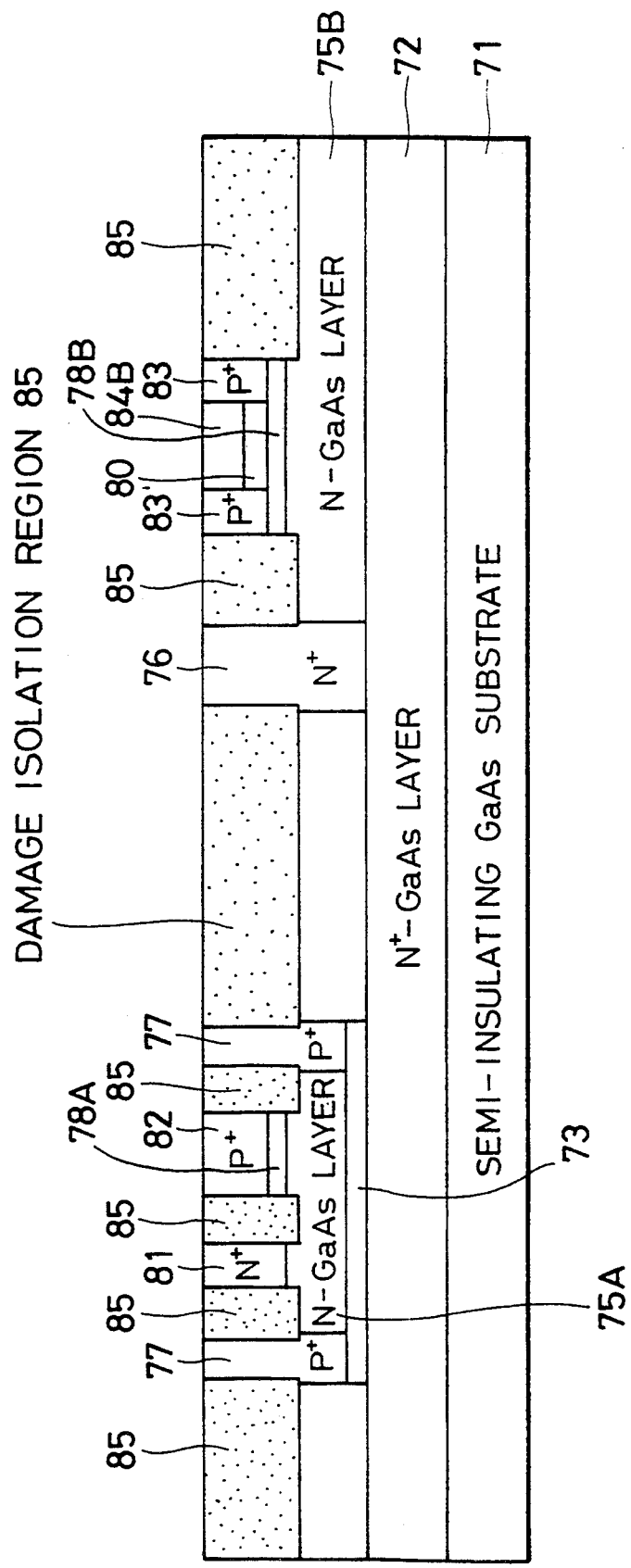
FIG. 15 is a cross sectional view of a heterojunction type of compound semiconductor integrated circuit according to the fourth embodiment, showing the final steps of fabricating damage isolation regions in a manufacturing process.

FIG. 15 is a cross sectional view of a heterojunction type of compound semiconductor integrated circuit according to the fourth embodiment, showing the final steps of fabricating damage isolation regions in a manufacturing process.

Figure 16:
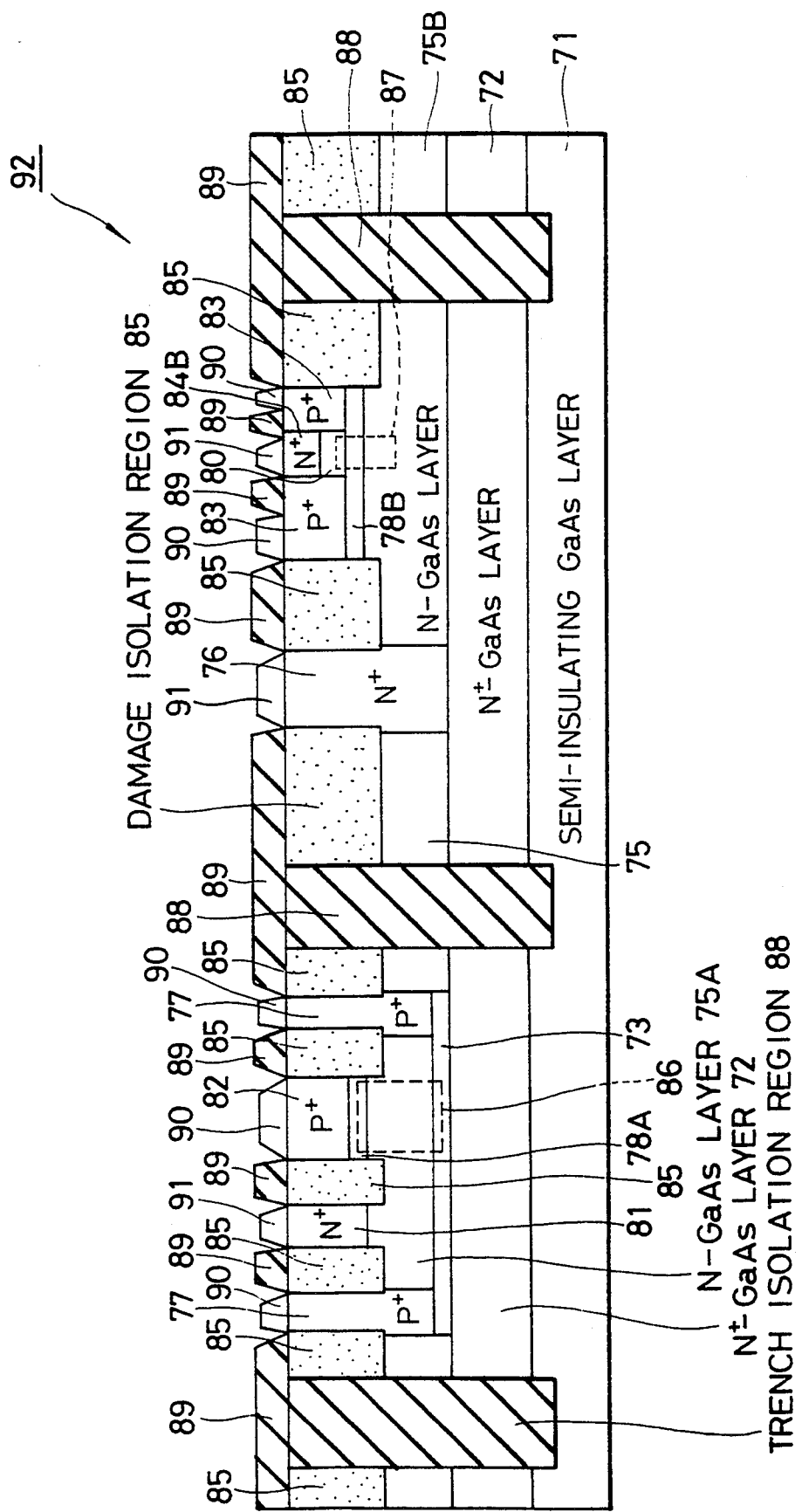
FIG. 16 is a cross sectional view of a heterojunction type of compound semiconductor integrated circuit which is manufactured by the steps shown in FIGS. 12 to 15.

FIG. 16 is a cross sectional view of a heterojunction type of compound semiconductor integrated circuit which is manufactured by the steps shown in FIGS. 12 to 15.

As shown in FIG. 12, a semi-insulating GaAs substrate 71 made of an N type GaAs material is prepared, and an GaAs material is deposited on the substrate 71 at a temperature of approximately 700° C. by utilizing the MOCVD method before the GaAs material is heavily doped in concentrations of $10^{19}$ atms/cm$^3$ by the donors to form an N+ GaAs layer 72. The N+ GaAs 72 has a thickness of 6000 Å and is mounted at first and second sections. Therefore, the positive holes cannot pass through the N+ GaAs 72 because the thick N+ GaAs 72 is heavily doped. On the other hand, the electrons can pass through the N+ GaAs 72 at low resistance.

Thereafter, an $Al_{0.3}Ga_{0.7}As$ material is deposited on the N+ GaAs 72 at a temperature of approximately 700° C. by utilizing the MOCVD method before the $Al_{0.3}Ga_{0.7}As$ material is heavily doped in concentrations of $10^{19}$ atms/cm$^3$ by acceptors to form a P+ $Al_{0.3}Ga_{0.7}As$ layer 73. The P+ $Al_{0.3}Ga_{0.7}As$ layer 73 has a thickness of 2000 Å. Thereafter, the P+ $Al_{0.3}Ga_{0.7}As$ layer 73 is coated with a photo resist 74. The photo resist 74 is attached on the P+ $Al_{0.3}Ga_{0.7}As$ layer 73 to draw a prescribed pattern in a first section. Thereafter, the P+ $Al_{0.3}Ga_{0.7}As$ layer 73 is selectively etched by utilizing the photo resist 74 as a shielding mask. Therefore, the P+ $Al_{0.3}Ga_{0.7}As$ layer 73 etched at the prescribed pattern is formed on the N+ GaAs layer 72 at the first section. The P+ $Al_{0.3}Ga_{0.7}As$ layer 73 functions as a collector of a vertical PNP transistor arranged at the first section. The photo resist 74 is then washed away by a prescribed solution.

Thereafter, as shown in FIG. 13, a GaAs material is deposited on both the N+ GaAs layer 72 and the P+ $Al_{0.3}Ga_{0.7}As$ layer 73 at a temperature of approximately 700° C. by utilizing the MOCVD method before the GaAs material is doped in concentrations of $10^{19}$ atms/cm$^3$ by donors to form an N GaAs layer 75. The N GaAs layer 75 has a thickness of 6000 Å. The N GaAs layer 75A positioned at the first section functions as a base of the vertical PNP transistor, and the N GaAs layer 75B positioned at the second section functions as a collector of a vertical NPN transistor.

Thereafter, the donors such as silicon (Si) ions are selectively implanted into a prescribed portion of the N GaAs layer 75B in concentrations of $10^{19}$ atms/cm$^3$ at the second section so that the N GaAs layer 75B implanted by the silicon ions is strongly inverted to an N+ GaAs material functioning as a collector contact layer 76. The collector contact layer 76 is utilized to collect the electrons in the N GaAs layer 75.

Thereafter, the acceptors such as beryllium (Be) ions are selectively implanted into the N GaAs layer 75A positioned on the periphery of the P+ $Al_{0.3}Ga_{0.7}As$ layer 73. Therefore, the N GaAs layer 75 implanted by the Be ions is strongly inverted to a P+ GaAs material functioning as a collector contact layer 77. The collector contact layer 77 is connected with the periphery of the P+ $Al_{0.3}Ga_{0.7}As$ layer 73 and is utilized to collect the positive holes existing in the P+ $Al_{0.3}Ga_{0.7}As$ layer 73.

Thereafter, a thin grading layer (not shown) is deposited on the N GaAs layers 75A, 75B, the collector contact layers 76, 77 by utilizing the MBE method. That is, the composition of the grading layer is gradually shifted from the composition GaAs to the composition $Al_{0.3}Ga_{0.7}As$.

Thereafter, an $Al_{0.3}Ga_{0.7}As$ material is deposited on the thin grading layer by utilizing the MOCVD method before the $Al_{0.3}Ga_{0.7}As$ material is heavily doped in concentrations of $10^{19}$ atms/cm$^3$ by the acceptors to form a P+ $Al_{0.3}Ga_{0.7}As$ layer 78. The P+ $Al_{0.3}Ga_{0.7}As$ layer 78 has a thickness of 1000 Å. In this case, because the grading layer is deposited between the N GaAs layer 75 and the P+ $Al_{0.3}Ga_{0.7}As$ layer 78, the conduction band energy Ec and a valence band energy Ev between the N GaAs layer 75 and the P+ $Al_{0.3}Ga_{0.7}As$ layer 78 are respectively smoothly shifted. Therefore, the positive holes can easily be transmitted from the P+ $Al_{0.3}Ga_{0.7}As$ layer 78 to the N GaAs layer 75 at the first section without being trapped in an interface region between the N GaAs layer 75 and the P+ $Al_{0.3}Ga_{0.7}As$ layer 78. Also, the electrons can be easily transmitted from the P+ $Al_{0.3}Ga_{0.7}As$ layer 78 to the N GaAs layer 75 at the second section without trapped in an interface region between the N GaAs layer 75 and the P+ $Al_{0.3}Ga_{0.7}As$ layer 78.

Thereafter, the P+ $Al_{0.3}Ga_{0.7}As$ layer 78 is coated with a photo resist 79. The photo resist 79 is drawn with a prescribed pattern. Thereafter, the P+ $Al_{0.3}Ga_{0.7}As$ layer 78 is selectively etched by utilizing the photo resist 79 as a shielding mask. Therefore, a P+ $Al_{0.3}Ga_{0.7}As$ layer 78A etched at the prescribed pattern are formed on the N GaAs layer 75A surrounded by the collector contact layer 77 at the first section, and a P+ $Al_{0.3}Ga_{0.7}As$ layer 78B etched at the prescribed pattern are formed on the N GaAs layer 75B at the second section. The P+ $Al_{0.3}Ga_{0.7}As$ layer 78A functions as an emitter of the vertical PNP transistor, and the P+ $Al_{0.3}Ga_{0.7}As$ layer 78B functions as a base of the vertical NPN transistor. The photo resist 79 is then washed away by a prescribed solution.

Thereafter, as shown in FIG. 14, an $Al_{0.3}Ga_{0.7}As$ material is deposited on the N GaAs layers 75A, 75B, the collector contact layers 76, 77, and the P+ $Al_{0.3}Ga_{0.7}As$ layers 78A, 78B at a temperature of approximately 700° C. by utilizing the MOCVD method before the $Al_{0.3}Ga_{0.7}As$ material which is doped in concentrations of $10^{17}$ atms/cm$^3$ by the donors to form an N $Al_{0.3}Ga_{0.7}As$ layer 80. The N $Al_{0.3}Ga_{0.7}As$ layer 80 has a thickness of approximately 1500 Å. The N $Al_{0.3}Ga_{0.7}As$ layer 80 on the P+ $Al_{0.3}Ga_{0.7}As$ layer 78B functions as an emitter of the vertical NPN transistor.

Thereafter, the donors such as Si ions are selectively implanted into the N $Al_{0.3}Ga_{0.7}As$ layer 80 positioned on the collector contact layer 76 so that the N $Al_{0.3}$ Ga$_{0.7}$As layer 80 is strongly inverted to an N+ Al$_{0.3}$Ga$_{0.7}$As material with a low resistance. Therefore, the N Al$_{0.3}$Ga$_{0.7}$As layer 80 positioned on the collector contact layer 76 is integrated with the collector contact layer 76, In the same time, the donors such as Si ions are selectively implanted into a prescribed portion of the N Al$_{0.3}$Ga$_{0.7}$As layer 80 positioned on the N GaAs layer 75A so that the prescribed portion of the N Al$_{0.3}$Ga$_{0.7}$As layer 80 is strongly inverted to an N+ Al$_{0.3}$Ga$_{0.7}$As material with a low resistance functioning as a base contact layer 81 of the PNP transistor.

Thereafter, acceptors such as Be ions are selectively implanted into the N Al$_{0.3}$Ga$_{0.7}$As layer 80 positioned on the collector contact layer 77 so that the N Al$_{0.3}$Ga$_{0.7}$As layer 80 is strongly inverted to a P+ Al$_{0.3}$Ga$_{0.7}$As material with a low resistance. Therefore, the N Al$_{0.3}$Ga$_{0.7}$As layer 80 positioned on the collector contact layer 77 is integrated with the collector contact layer 77.

In the same time, the acceptors such as Be ions are selectively implanted into the N Al$_{0.3}$Ga$_{0.7}$As layer 80 positioned on the P+ Al$_{0.3}$Ga$_{0.7}$As layer 78A so that the N Al$_{0.3}$Ga$_{0.7}$As layer 80 is strongly inverted to an P+ Al$_{0.3}$Ga$_{0.7}$As material with a low resistance functioning as an emitter contact layer 82 of the PNP transistor for applying the positive holes to the P+ Al$_{0.3}$Ga$_{0.7}$As layer 78A.

In addition, the acceptors such as Be ions are selectively implanted into the N Al$_{0.3}$Ga$_{0.7}$As layer 80 positioned on the periphery of the P+ Al$_{0.3}$Ga$_{0.7}$As layer 78B so that the N Al$_{0.3}$Ga$_{0.7}$As layer 80 is strongly inverted to a P+ Al$_{0.3}$Ga$_{0.7}$As material with a low resistance functioning as a base contact layer 83 of the NPN transistor. In this case, the N Al$_{0.3}$Ga$_{0.7}$As layer 80 surrounded by the base contact layer 83 on the P+ Al$_{0.3}$Ga$_{0.7}$As layer 78B functions as an emitter of the NPN transistor.

Thereafter, a GaAs material is deposited on the collector contact layers 76, 77, the N Al$_{0.3}$Ga$_{0.7}$As layer 80, the base contact layers 81, 83, and the emitter contact layer 82 at a temperature of approximately 700° C. by utilizing the MOCVD method before the GaAs material is doped in concentrations of $10^{17}$ atms/cm$^3$ by the donors to form an N GaAs layer 84.

Thereafter, the donors such as Si ions are selectively implanted into the N GaAs layer 84 positioned on the collector contact layer 76, the base contact layer 81, and the N Al$_{0.3}$Ga$_{0.7}$As layer 80 surrounded by the base contact layer 83 so that the N GaAs layer 84 is strongly inverted to N+ GaAs layers. Therefore, each converted N+ GaAs layer 84 is integrated with the collector contact layer 76 or the base contact layer 81. In addition, the converted N+ GaAs layer 84 positioned on the N Al$_{0.3}$Ga$_{0.7}$As layer 80 surrounded by the base contact layer 83 functions as a emitter contact layer 84B of the NPN transistor.

Thereafter, the acceptors such as Be ions are selectively implanted into the N GaAs layer 82 positioned on the collector contact layer 77, the emitter contact layer 82, and the base contact layer 83. Therefore, the N GaAs layer 82 is strongly inverted to P+ GaAs layers with low resistance. Therefore, each inverted P+ GaAs layer is integrated with the collector contact layer 77, the emitter contact layer 82, or the base contact layer 83.

Accordingly, the surfaces of the collector contact layers 76, 77, the base contact layers 81, 83, and the emitter contact layers 82, 84B have the same height as that of the N GaAs layer 84.

Thereafter, the collector contact layers 76, 77, the base contact layers 81, 83, and the emitter contact layers 82, 84B are coated with a comparatively thick photo resist (not shown). Thereafter, boron ions (B+) or hydrogen ions (H+) are selectively implanted into the N GaAs layer 84, the N Al$_{0.3}$Ga$_{0.7}$As layer 80, and the upper portion of the N GaAs layer 75 so that damage isolation regions 85 are formed as shown in FIG. 15. In this case, the boron ions (B+) or the hydrogen ions (H+) cannot pass through the photo resist. Therefore, the damage isolation regions 85 are formed in regions where the photo resist is not coated. The electrons and the positive holes cannot pass through the damage isolation regions 85 because a large number of atomic bonds between the atoms Al, Ga, and As are cut off in the layers 75, 80, 84 so that a large number of trapping levels are generated. The photo resist is then washed away by a prescribed solution.

Therefore, the collector contact layer 77, the base contact layer 81, and the emitter contact layer 82 are electrically isolated from one another in the first section because the transmission of both the electrons and the positive holes are interfered by the damage isolation regions 85. In the same manner, the collector contact layer 76 is electrically isolated from the base contact layer 83 and the emitter contact layer 84B in the second section.

Thereafter, a photo resist (not shown) is coated over the collector contact layer 77, the base contact layer 81, and the emitter contact layer 83 connected with the vertical PNP transistor 86 comprising the P+ Al$_{0.3}$Ga$_{0.7}$As layer 73 functioning as the collector, the N GaAs layer 75A functioning as the base, and the P+ Al$_{0.3}$Ga$_{0.7}$As layer 78A functioning as the emitter. In addition, a photo resist (not shown) is coated over the collector contact layer 76, the base contact layer 83, and the emitter contact layer 84B connected with the vertical NPN transistor 87 comprising the N GaAs 75B functioning as the collector, the P+ Al$_{0.3}$Ga$_{0.7}$As layer 78B functioning as the base, and the N Al$_{0.3}$Ga$_{0.7}$As layer 80 functioning as the emitter.

Thereafter, argon (At) ions are radiated on the damage isolation regions 85 by the Ar ion milling method so that a trench reaching the semi-insulating substrate 71 is formed between the vertical PNP and NPN transistors 86, 87. In addition, another trench reaching the semi-insulating substrate 71 is formed at the periphery of both the vertical PNP and NPN transistors 86, 87. In this case, the Ar ions cannot penetrate the photo resists. In addition, the trenches have a flat-shaped bottom. Therefore, the stress generated in the bottom of the trenches is dispersed so that no adverse influence is generated by trenching the damage isolation regions 85. The photo resists are then washed away by a prescribed solution.

Thereafter, as shown in FIG. 16, a Si$_3$N$_4$ material is deposited into the trenches to fabricate trench isolation regions 88. Moreover, the Si$_3$N$_4$ material is deposition on the flat surface of the vertical PNP and NPN transistors 86, 87 so that a Si$_3$N$_4$ film 89 is formed over the entire flat surface. Here, the Si$_3$N$_4$ material is an insulator. Therefore, the vertical PNP and NPN transistors 86, 87 are isolated from each other. In addition, the other transistors which are adjacent to the transistor 86 or 87 and are arranged on the semi-insulating substrate 71 and are isolated from the transistors 86, 87.

Specifically, because the N+ GaAs 72 is doped in high concentrations, the positive holes transmitting through the P+ Al$_{0.3}$Ga$_{0.7}$As layer 73 cannot pass through the N+ GaAs 72.

Thereafter, the Si$_3$N$_4$ film 89 is selectively etched to form contact holes on the collector contact layers 76, 77 the base contact layers 81, 83, and the emitter contact layers 82, 84B. The contact holes on the P+ contact layers such as the collector contact layer 77, the emitter contact layer 82, and the base contact layer 83 are buried by an ohmic metal such as AuZn so that AuZn electrodes 90 are formed on the P+ contact layers. In addition, the contact holes on the N+ contact layers such as the collector contact layer 76, the base contact layer 81, and the emitter contact layers 84B are buried by an ohmic metal such as AuGeNi so that AuGeNi electrodes 91 are formed on the N+ contact layers. The AuZn and AuGeNi electrodes 90, 91 are alloyed at a foaming gas atmosphere by the RTA method.

Thereafter, hard-wires are connected with the AuZn and AuGeNi electrodes 90, 91. In brief, a SiO$_2$ film is deposited on the AuZn and AuGeNi electrodes 90, 91 and the Si$_3$N$_4$ film 89. Thereafter, the SiO$_2$ film 89 on the AuZn and AuGeNi electrodes 90, 91 is selectively etched off before a barrier metal is selectively deposited on the AuZn and AuGeNi electrodes 90, 91. Thereafter, a TiWAu film is deposited on the SiO$_2$ film and the barrier metal by an etching method before the TiWAu film is selectively etched off by the ion milling method to form the hard-wires according to a prescribed wiring pattern.

Therefore, a heterojunction type of compound semiconductor integrated circuit 92 according to the fourth embodiment is manufactured.

The barrier metal does not react to the electrons and the positive holes, while metals such as Ti, Pt, and Au react on the electrons and the positive holes. Therefore, the hard-wires do not deteriorate even though the transistors 86, 87 are operated for a long time.

In the above steps, the vertical PNP and NPN transistors 86, 87 are fabricated on the same substrate 71, In addition, the surfaces of the contact layers are positioned at the same height and are reliably insulated from one another. Moreover, the electrodes connected with the contact layers are arranged at one side of the compound semiconductor integrated circuit 92.

Accordingly, the hard-wires can be securely connected because the surfaces of the contact layers are positioned at the same height.

Moreover, a multiple layer wiring can be easily implemented because the electrodes connected with the contact layers are arranged at one side and are positioned at the same height. Therefore, the compound semiconductor integrated circuit 92 can be manufactured at high yield.

Moreover, the transistors can be fabricated in miniature because the transistors are fabricated on the same substrate 71 and are vertically arranged. Therefore, a large scale integrated circuit can be easily manufactured.

Moreover, the operational characteristics such as the current amplification are largely improved because the compound semiconductor integrated circuit 92 is manufactured by a plurality of compound semiconductors such as AlGaAs and GaAs. In other words, the circuits 92 has a heterojunction.

In the above embodiments, the compound semiconductor integrated circuits 49, 53, 60, 92 are manufactured by utilizing the AlGaAs/GaAs type of compound semiconductors. However, it is preferable that the compound semiconductor integrated circuits 49, 53, 60, 92 be manufactured by utilizing the InP type of compound semiconductor.

Moreover, it is preferable that a P type substrate be utilized in place of the semi-insulating GaAs substrate 71 made of the N type GaAs material because the positive holes are insulated in the N+ GaAs 72.

In addition, it is preferable that a P+ type GaAs layer be utilized in place of the N+ type GaAs layer 72. In this case, each conductive type such as P type or N type is changed to an inverse type in the compound semiconductor integrated circuits 49, 53, 60, 92.

Further, a pair of output terminals C1, C2 are provided in the circuits 49, 53, 60, 92. However, it is preferable that a large number of output terminals be provided.

Furthermore, the compound semiconductor integrated circuits 49, 53, 60, 92 are manufactured by utilizing the MOCVD method. However, it is preferable that the layers composing the circuits 49, 53, 60, 92 be deposited by utilizing the MBE method.

Still further, it is preferable that the compositions of the emitter 78A, the base 75A, and the collector 73 in the PNP transistor 86 differ from one another. In addition, it is preferable that the compositions of the emitter 80, the base 78B, and the collector 75B in the NPN transistor 87 differ from one another. In this case, each transistor has a plurality of heterojunctions.

Next, a fifth embodiment is described with reference to FIGS. 17 to 21.

Figure 17:
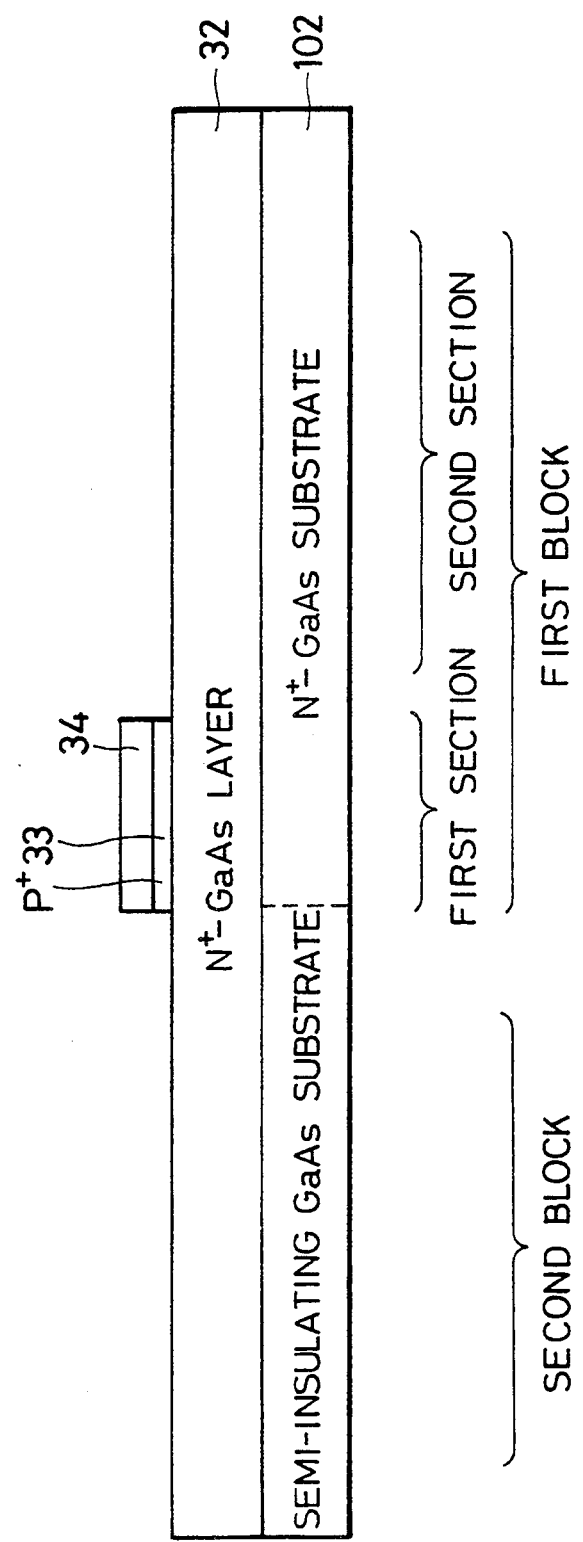
FIG. 17 is a cross sectional view of a heterojunction type of compound semiconductor integrated circuit according to the fifth embodiment, showing the starting steps of fabricating an emitter of a vertical PNP transistor in a manufacturing process.

FIG. 17 is a cross sectional view of a heterojunction type of compound semiconductor integrated circuit according to the fifth embodiment, showing the starting steps of fabricating an emitter of a vertical PNP transistor in a manufacturing process.

Figure 18:
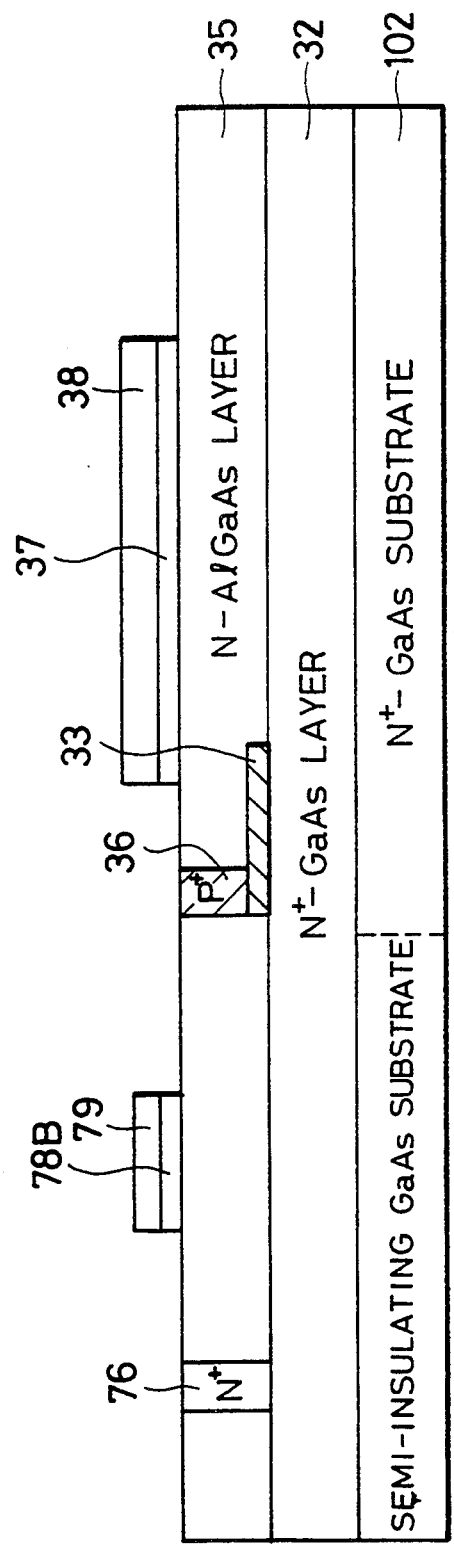
FIG. 18 is a cross sectional view of a heterojunction type of compound semiconductor integrated circuit according to the fifth embodiment, showing the first middle steps of fabricating both an emitter and a base of vertical first NPN transistor in a manufacturing process.

FIG. 18 is a cross sectional view of a heterojunction type of compound semiconductor integrated circuit according to the fifth embodiment, showing the first middle steps of fabricating both an emitter and a base of vertical first NPN transistor in a manufacturing process.

Figure 19:
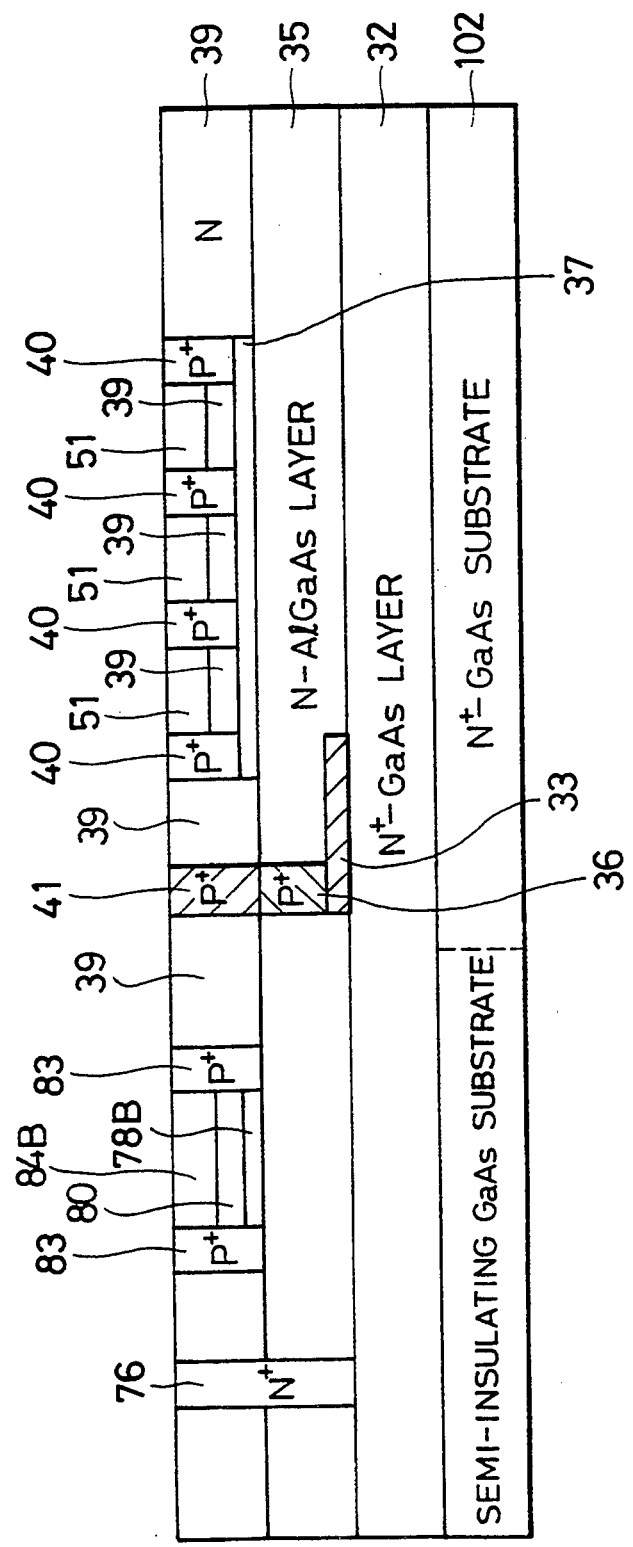
FIG. 19 is a cross sectional view of a heterojunction type of compound semiconductor integrated circuit according to the fifth embodiment, showing the second middle step of fabricating collectors of vertical NPN transistors in a manufacturing process.

FIG. 19 is a cross sectional view of a heterojunction type of compound semiconductor integrated circuit according to the fifth embodiment, showing the second middle steps of fabricating collectors of vertical NPN transistors in a manufacturing process.

Figure 20:
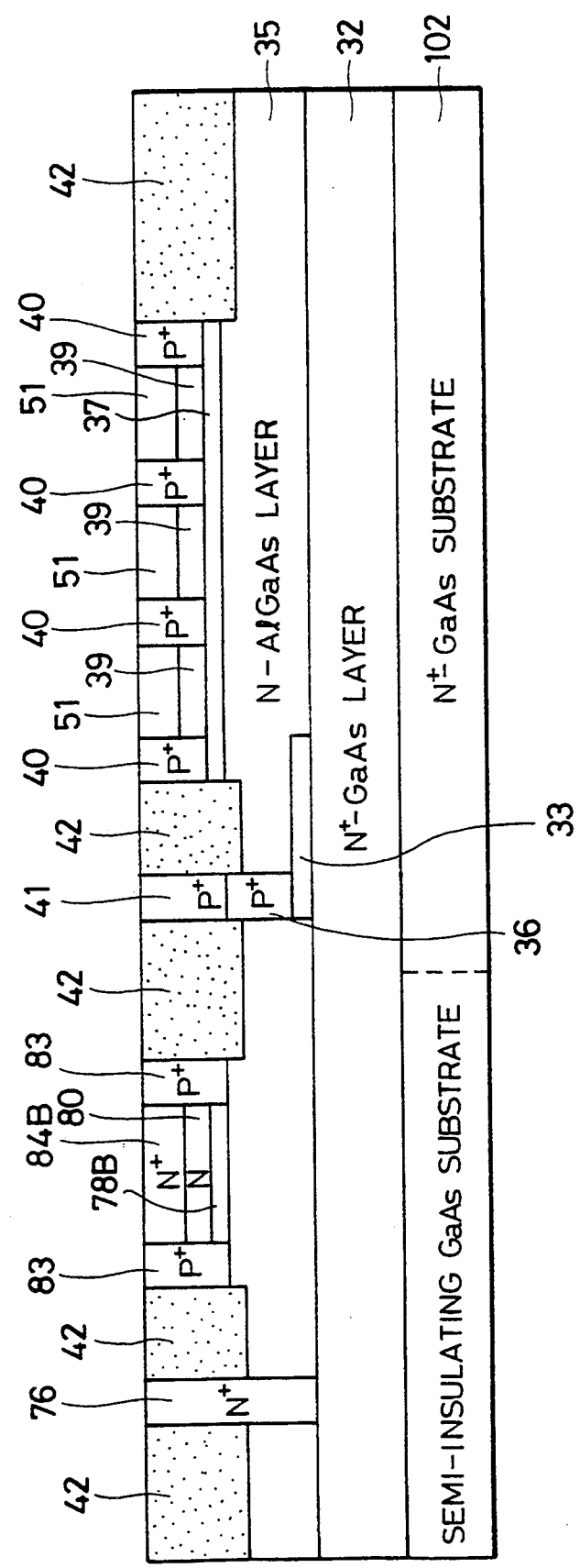
FIG. 20 is a cross sectional view of a heterojunction type of compound semiconductor integrated circuit according to the fifth embodiment, showing the final steps of fabricating damage isolation regions in a manufacturing process.

FIG. 20 is a cross sectional view of a heterojunction type of compound semiconductor integrated circuit according to the fifth embodiment, showing the final steps of fabricating damage isolation regions in a manufacturing process.

Figure 21:
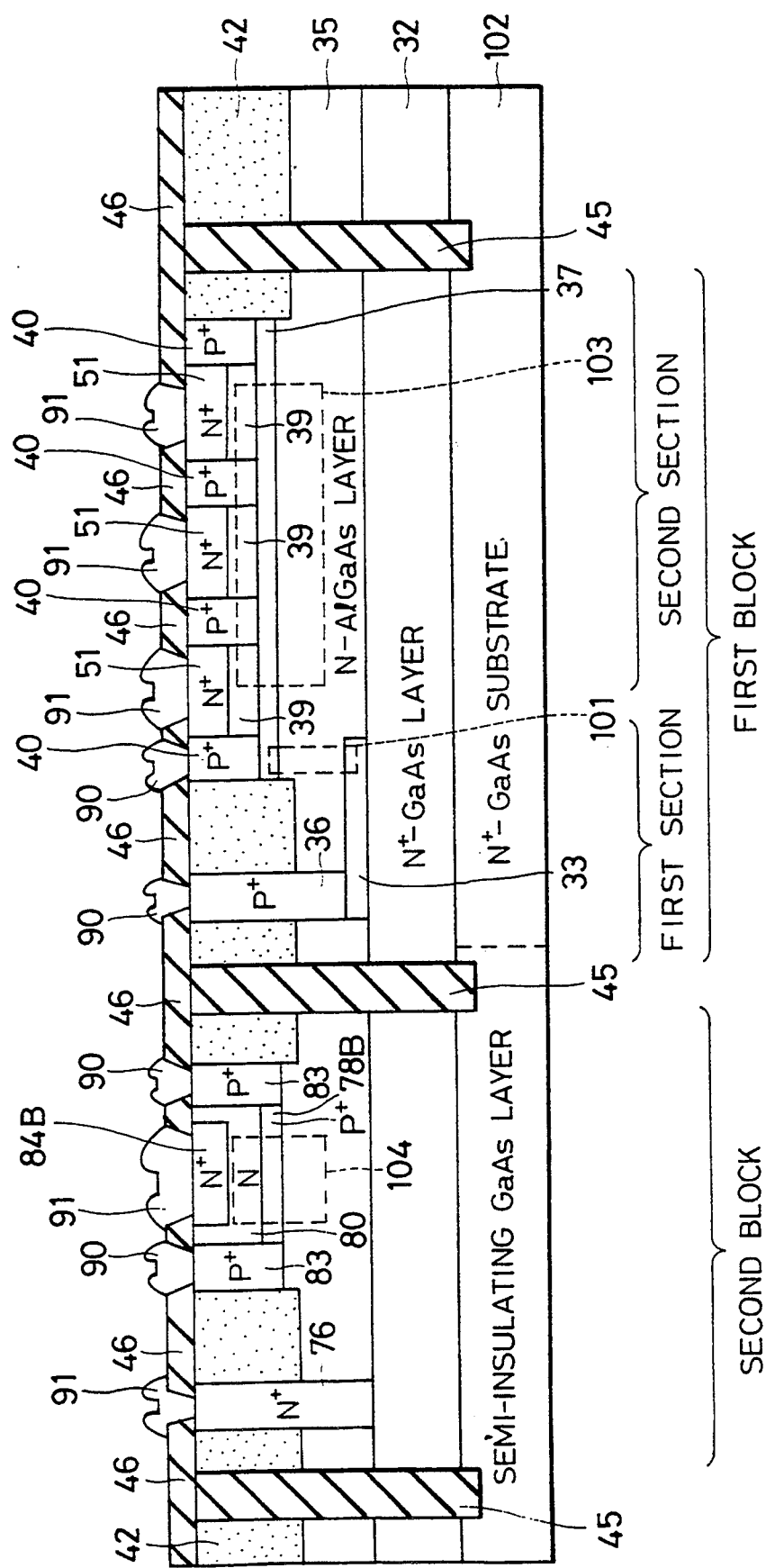
FIG. 21 is a cross sectional view of a heterojunction type of compound semiconductor integrated circuit which is manufactured by the steps shown in FIGS. 17 to 20.

FIG. 21 is a cross sectional view of a heterojunction type of compound semiconductor integrated circuit which is manufactured by the steps shown in FIGS. 17 to 20.

As shown in FIGS. 16 to 21, an IIL circuit in which a vertical PNP transistor 101 is fabricated on the substrate 102 at a first section and a vertical first NPN transistor 103 is fabricated on the substrate 102 at a second section is manufactured as a first block, and a vertical second NPN transistor 104 is fabricated on a substrate 102 as a second block.

The substrate 102 at the first block is made of an N+ GaAs material in the same manner as the N+ GaAs substrate 31, and the substrate 102 at the second block is formed by a semi-insulating material in the same manner as the semi-insulating GaAs substrate 71.

Therefore, the manufacturing method and the configuration of both the vertical PNP transistor 101 and the vertical first NPN transistor 103 are the same as those of both the vertical PNP transistor 43 and the vertical NPN transistor 54 described in the second embodiment. In addition, the manufacturing method and the configuration of the vertical second NPN transistor 104 are the same as those of the vertical NPN transistor 87 described in the fourth embodiment.

Therefore, a large number of PNP and NPN transistors and circuits such as the IIL circuit can be arranged on a substrate. Accordingly, a large scaled heterojunction type of compound semiconductor integrated circuit can be easily manufactured.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A heterojunction type of compound semiconductor integrated circuit in which a PNP transistor is fabricated, comprising:

an N type substrate made of a first compound semiconductor for mounting the PNP transistor and for insulating positive holes transmitted in the PNP transistor;

a P type second compound semiconductor limitedly arranged on a part of the substrate for functioning as an emitter of the PNP transistor;

an N type third compound semiconductor arranged on both the second compound semiconductor and the substrate for functioning as a base of the PNP transistor, electrons being applied from the substrate to the third compound semiconductor;

a P type fourth compound semiconductor limitedly arranged on a part of the N type third compound semiconductor, (1) a part of the fourth compound semiconductor being arranged just above a first part of the second compound semiconductor, and (2) the part of the fourth compound semiconductor functioning as a collector of the PNP transistor;

a P+ type fifth compound semiconductor limitedly arranged on the part of the fourth compound semiconductor for functioning as a collector contact layer of the PNP transistor;

an emitter contact layer limitedly arranged on a second part of the second compound semiconductor for supplying positive holes to the second compound semiconductor, the surface of the emitter contact layer being the same height as that of the fifth compound semiconductor so as to form a flat surface; and an isolation region sandwiched between the emitter contact layer and the fifth compound semiconductor for electrically isolating the emitter contact layer from both the second P+ type fifth compound semiconductor and the fourth compound semiconductor, the surface of the isolation region being the same height as the flat surface.

2. A circuit according to claim 1 including:

spaced N type sixth compound semiconductors arranged on the remaining part of the fourth compound semiconductor for respectively functioning as a collector of an NPN transistor, (1) the surface of the sixth compound semiconductors being the same height as the flat surface, (2) the remaining part of the fourth compound semiconductor functioning as a base of the NPN transistor, and (3) the third compound semiconductor just under the remaining part of the fourth compound semiconductor functioning as an emitter of the NPN transistor: and spaced P type seventh compound semiconductors respectively sandwiched between the sixth compound semiconductors for electrically isolating one sixth compound semiconductor from the other sixth compound semiconductors, the surface of the sixth compound semiconductors being the same height as the flat surface.

3. A circuit according to claim 1 in which atomic bonds in the isolation region are broken.

4. A circuit according to claim 2 including:

a trench isolation region enclosing both the PNP and NPN transistors for electrically isolating both the PNP and NPN transistors.

5. A circuit according to claim 1 in which the second and third compound semiconductors are made of an $Al_{0.3}Ga_{0.7}As$ material, and the fourth and fifth compound semiconductors are made of a GaAs material.

6. A circuit according to claim 5 including:

a thin grading layer epitaxially growth on the third compound semiconductor, the composition of the this grading layer being gradually shifted from the composition $Al_{0.3}Ga_{0.7}As$ to the composition GaAs.

7. A circuit according to claim 1 in which the area of the first part of the second compound semiconductor is larger than that of the part of the fourth compound semiconductor.

8. A circuit according to claim 2 in which the upper portion of each sixth compound semiconductor is strongly inverted to an N+ conductive type.

9. A circuit according to claim 1 including:

a semi-insulating substrate integrally formed with the N type substrate for mounting an NPN transistor;

a trench isolation region enclosing the PNP transistor for electrically isolating the PNP transistor from the NPN transistor;

an N type sixth compound semiconductor arranged on the semi-insulating substrate for functioning as a collector of the NPN transistor;

an NPN collector contact layer limitedly arranged on a first part of the sixth compound semiconductor for receiving electrons from the sixth compound semiconductor, the surface of the NPN collector contact layer being the same height as the flat surface;

a P type seventh compound semiconductor limitedly arranged on a second part of the sixth compound semiconductor for functioning as a base of the NPN transistor;

an NPN base contact layer limitedly arranged on a first part of the seventh compound semiconductor for applying a positive voltage to the seventh compound semiconductor, the surface of the NPN base contact layer being the same height as the flat surface;

an N type eighth compound semiconductor limitedly arranged on a second part of the seventh compound semiconductor for functioning as an emitter of the NPN transistor;

an NPN emitter contact layer arranged on the eighth compound semiconductor for supplying the electrons to the eighth compound semiconductor, the surface of the NPN emitter contact layer being the same height as the flat surface; and NPN isolation regions for electrically isolating the collector contact layer, the emitter contact layer and the base contact layer from one another, each surface of the NPN isolation regions being the same height as the flat surface.

10. A heterojunction type of compound semiconductor integrated circuit in which a PNP transistor is fabricated, comprising:

an N type substrate made of a first compound semiconductor for mounting the PNP transistor and for insulating positive holes transmitted in the PNP transistor;

a P type second compound semiconductor limitedly arranged on a part of the substrate for functioning as an emitter of the PNP transistor;

an N type third compound semiconductor arranged on both the second compound semiconductor and the substrate for functioning as a base of the PNP transistor, electrons being applied from the substrate to the third compound semiconductor;

spaced P+ type fourth compound semiconductors limitedly arranged just above a first part of the second compound semiconductor, each fourth compound semiconductor functioning as a collector of the PNP transistor;

spaced P+ type fifth compound semiconductors arranged on the fourth compound semiconductors for respectively functioning as a collector contact layer of the PNP transistor;

collector isolation regions respectively sandwiched between the spaced P+ type fourth compound semiconductors and between the spaced P+ type fifth compound semiconductors for electrically isolating the spaced P+ type fourth compound semiconductors from one another and electrically isolating the spaced P+ type fifth compound semiconductors from one another;

an emitter contact layer limitedly arranged on a second part of the second compound semiconductor for supplying positive holes to the second compound semiconductor, the surface of the emitter contact layer being the same height as that of the fifth compound semiconductors so as to form a flat surface; and an emitter isolation region sandwiched between the emitter contact layer and the fourth compound semiconductor for electrically isolating the emitter contact layer from both the fifth compound semiconductor and the fourth compound semiconductor, the surface of the emitter isolation region being the same in height as the flat surface.

11. A heterojunction type of compound semiconductor integrated circuit in which a PNP transistor is fabricated, comprising:

a semi-insulating substrate for mounting the PNP transistor;

an N type first compound semiconductor arranged on the semi-insulating substrate for insulating positive holes transmitted in the PNP transistor;

a P type second compound semiconductor limitedly arranged on a first part of the first compound semiconductor for functioning as a collector of the PNP transistor;

a collector contact layer limitedly arranged on a first part of the second compound semiconductor for receiving positive holes from the second compound semiconductor:

an N type third compound semiconductor arranged on both the second compound semiconductor and the first compound semiconductor, the third compound semiconductor on the second compound semiconductor functioning as a base of the PNP transistor;

a P type fourth compound semiconductor arranged on the N type third compound semiconductor, (1) the fourth compound semiconductor being arranged just above a second part of the second compound semiconductor, and (2) the fourth compound semiconductor functioning as an emitter of the PNP transistor;

an emitter contact layer arranged on the fourth compound semiconductor for supplying the positive holes to the fourth compound semiconductor, the surface of the emitter contact layer being the same height as that of the collector contact layer so as to form a flat surface:

a base contact layer arranged just above a third part of the second compound semiconductor for applying a negative voltage to the third compound semiconductor, the surface of the base contact layer being the same height as the flat surface; and isolation regions arranged on the third compound semiconductor for electrically isolating the emitter contact layer, the base contact layer and the collector contact layer from one another, each surface of the isolation regions being the same height as the flat surface.

12. A circuit according to claim 1, further including:

a P type fifth compound semiconductor arranged on the N type third compound semiconductor, in which;

(1) the fifth compound semiconductor is interposed between the fourth compound semiconductor and the second part of the first compound semiconductor, (2) the fifth compound semiconductor functions as a base of an NPN transistor, and (3) the third compound semiconductor on the second part of the first compound semiconductor functions as a collector of the NPN transistor;

an NPN collector contact layer arranged on the third compound semiconductor for receiving electrons from the third compound semiconductor in which;

(1) the NPN collector contact layer is limitedly arranged on a third part of the first compound semiconductor, and (2) the surface of the NPN collector contact layer being the same height as the flat surface;

an NPN base contact layer arranged limitedly on a part of the fifth compound semiconductor for applying a positive voltage to the fifth compound semiconductor, the surface of the NPN base contact layer being the same height as the flat surface;

an N type sixth compound semiconductor limitedly arranged on the remaining part of the fifth compound semiconductor for functioning as an emitter of the NPN transistor, the surface of the sixth compound semiconductor being the same height as the flat surface; and an NPN isolation region sandwiched between the NPN collector contact layer and the fourth compound semiconductor for electrically isolating the NPN collector contact layer from both the sixth compound semiconductor and the NPN base contact layer, the surface of the NPN isolation region being the same height as the flat surface.

13. A circuit according to claim 12 in which atomic bonds in the isolation regions and the NPN isolation region are broken.

14. A circuit according to claim 12 including:
a trench isolation region enclosing both the PNP and NPN transistors for electrically isolating both the PNP and NPN transistors.

15. A circuit according to claim 11 in which the semi-insulating substrate is made of an N type GaAs material.

16. A circuit according to claim 11 in which the semi-insulating substrate is made of a P type GaAs material.

* * * * *